(12) United States Patent
Yamazaki

(10) Patent No.: US 9,941,414 B2
(45) Date of Patent: Apr. 10, 2018

(54) METAL OXIDE SEMICONDUCTOR DEVICE

(71) Applicant: Semiconductor Energy Laboratory Co., Ltd., Atsugi-shi, Kanagawa-ken (JP)

(72) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/241,113

(22) Filed: Aug. 19, 2016

(65) Prior Publication Data

US 2016/0359049 A1    Dec. 8, 2016

Related U.S. Application Data

(63) Continuation of application No. 14/690,533, filed on Apr. 20, 2015, now Pat. No. 9,425,295, which is a (Continued)

(30) Foreign Application Priority Data

Mar. 26, 2010 (JP) .................................. 2010-072256

(51) Int. Cl.
*H01L 29/00* (2006.01)
*H01L 29/786* (2006.01)
(Continued)

(52) U.S. Cl.
CPC .......... *H01L 29/7869* (2013.01); *H01L 29/24* (2013.01); *H01L 29/42356* (2013.01);
(Continued)

(58) Field of Classification Search
CPC .......... H01L 29/78606; H01L 29/7869; H01L 29/42356; H01L 29/66969; H01L 29/24; H01L 29/78693
See application file for complete search history.

(56) References Cited

U.S. PATENT DOCUMENTS 5,731,856 A    3/1998 Kim et al.
5,744,864 A    4/1998 Cillessen et al.
(Continued)

FOREIGN PATENT DOCUMENTS

CN    101626036 A    1/2010
CN    101656271 A    2/2010
(Continued)

OTHER PUBLICATIONS

Minami.T, "New n-Type Transparent Conducting Oxides", MRS Bulletin, Aug. 1, 2000, pp. 38-44.
(Continued)

*Primary Examiner* — Nikolay Yushin
(74) *Attorney, Agent, or Firm* — Fish & Richardson P.C.

(57) ABSTRACT

In a transistor including an oxide semiconductor film, a metal oxide film which has a function of preventing electrification and covers a source electrode and a drain electrode is formed in contact with the oxide semiconductor film, and then, heat treatment is performed. Through the heat treatment, impurities such as hydrogen, moisture, a hydroxyl group, or hydride are intentionally removed from the oxide semiconductor film, whereby the oxide semiconductor film is highly purified. By providing the metal oxide film, generation of a parasitic channel on the back channel side of the oxide semiconductor film in the transistor is prevented.

16 Claims, 9 Drawing Sheets

Related U.S. Application Data continuation of application No. 13/913,601, filed on Jun. 10, 2013, now Pat. No. 9,012,908, which is a continuation of application No. 13/071,802, filed on Mar. 25, 2011, now Pat. No. 8,461,584.

(51) Int. Cl.
*H01L 29/66* (2006.01)
*H01L 29/24* (2006.01)
*H01L 29/423* (2006.01)

(52) U.S. Cl.
CPC .. *H01L 29/66969* (2013.01); *H01L 29/78606* (2013.01); *H01L 29/78693* (2013.01)

(56) References Cited

U.S. PATENT DOCUMENTS

| | | | |
|---|---|---|---|
| 6,294,274 | B1 | 9/2001 | Kawazoe et al. |
| 6,391,462 | B1 | 5/2002 | Jang |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,445,988 | B2 | 11/2008 | Cheng et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,601,984 | B2 | 10/2009 | Sano et al. |
| 7,674,650 | B2 | 3/2010 | Akimoto et al. |
| 7,732,819 | B2 | 6/2010 | Akimoto et al. |
| 7,791,072 | B2 | 9/2010 | Kumomi et al. |
| 7,791,074 | B2 | 9/2010 | Iwasaki |
| 7,855,379 | B2 | 12/2010 | Hayashi et al. |
| 7,906,780 | B2 | 3/2011 | Iwasaki |
| 7,935,582 | B2 | 5/2011 | Iwasaki |
| 7,956,361 | B2 | 6/2011 | Iwasaki |
| 7,977,675 | B2 | 7/2011 | Kawamura et al. |
| 7,994,500 | B2 | 8/2011 | Kim et al. |
| 8,003,981 | B2 | 8/2011 | Iwasaki et al. |
| 8,008,707 | B2 | 8/2011 | Matsuo et al. |
| 8,058,645 | B2 | 11/2011 | Jeong et al. |
| 8,088,652 | B2 | 1/2012 | Hayashi et al. |
| 8,134,151 | B2 | 3/2012 | Imai |
| 8,148,779 | B2 | 4/2012 | Jeong et al. |
| 8,154,024 | B2 | 4/2012 | Iwasaki |
| 8,164,256 | B2 | 4/2012 | Sano et al. |
| 8,178,884 | B2 * | 5/2012 | Ha ............ H01L 29/7869 257/291 |
| 8,178,926 | B2 | 5/2012 | Nakayama |
| 8,188,480 | B2 | 5/2012 | Itai |
| 8,193,535 | B2 | 6/2012 | Ha et al. |
| 8,203,143 | B2 | 6/2012 | Imai |
| 8,207,014 | B2 | 6/2012 | Sasaki et al. |
| 8,216,878 | B2 | 7/2012 | Sasaki et al. |
| 8,436,349 | B2 | 5/2013 | Sano et al. |
| 8,497,502 | B2 | 7/2013 | Yaegashi |
| 8,502,217 | B2 | 8/2013 | Sato et al. |
| 8,541,944 | B2 | 9/2013 | Sano et al. |
| 8,581,243 | B2 | 11/2013 | Takahashi et al. |
| 9,153,703 | B2 | 10/2015 | Kaji et al. |
| 2001/0023091 | A1 | 9/2001 | Yamaguchi et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0072439 | A1 | 3/2007 | Akimoto et al. |
| 2007/0090365 | A1 | 4/2007 | Hayashi et al. |
| 2007/0108446 | A1 | 5/2007 | Akimoto |
| 2007/0131276 | A1 | 6/2007 | Nee |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2008/0308806 | A1 | 12/2008 | Akimoto et al. |
| 2009/0001881 | A1 | 1/2009 | Nakayama |
| 2009/0068773 | A1 | 3/2009 | Lai et al. |
| 2009/0073325 | A1 | 3/2009 | Kuwabara et al. |
| 2009/0090914 | A1 | 4/2009 | Yano et al. |
| 2009/0114910 | A1 | 5/2009 | Chang |
| 2009/0127551 | A1 | 5/2009 | Imai |
| 2009/0134399 | A1 | 5/2009 | Sakakura et al. |
| 2009/0142887 | A1 | 6/2009 | Son et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2009/0321731 | A1 | 12/2009 | Jeong et al. |
| 2009/0321732 | A1 | 12/2009 | Kim et al. |
| 2010/0006833 | A1 * | 1/2010 | Ha ............ H01L 29/7869 257/43 |
| 2010/0025675 | A1 | 2/2010 | Yamazaki et al. |

(56) References Cited

U.S. PATENT DOCUMENTS

| | | |
|---|---|---|
| 2010/0032668 A1 | 2/2010 | Yamazaki et al. |
| 2010/0038641 A1 | 2/2010 | Imai |
| 2010/0044711 A1 | 2/2010 | Imai |
| 2010/0051937 A1 | 3/2010 | Kaji et al. |
| 2010/0059746 A1 | 3/2010 | Itai |
| 2010/0065842 A1 | 3/2010 | Yamazaki et al. |
| 2010/0065844 A1 | 3/2010 | Tokunaga |
| 2010/0092800 A1 | 4/2010 | Itagaki et al. |
| 2010/0102312 A1 | 4/2010 | Yamazaki et al. |
| 2010/0109002 A1 | 5/2010 | Itagaki et al. |
| 2010/0117146 A1 | 5/2010 | Ikeda et al. |
| 2010/0133531 A1 | 6/2010 | Akimoto et al. |
| 2010/0159639 A1 | 6/2010 | Sakata |
| 2010/0163863 A1 | 7/2010 | Yaegashi |
| 2010/0295042 A1 | 11/2010 | Yano et al. |
| 2010/0301328 A1 | 12/2010 | Yamazaki et al. |
| 2010/0320457 A1 | 12/2010 | Matsubara et al. |
| 2011/0003427 A1 | 1/2011 | Sasaki et al. |
| 2011/0053322 A1 | 3/2011 | Sasaki et al. |
| 2011/0065216 A1 | 3/2011 | Kaji et al. |
| 2011/0070536 A1 | 3/2011 | Yagi et al. |
| 2011/0089416 A1 | 4/2011 | Yamazaki et al. |
| 2011/0127528 A1 | 6/2011 | Matsumuro |
| 2011/0193083 A1 | 8/2011 | Kim et al. |
| 2011/0215328 A1 | 9/2011 | Morosawa et al. |
| 2011/0215331 A1 | 9/2011 | Yamazaki et al. |
| 2011/0233541 A1 | 9/2011 | Yamazaki |
| 2011/0233542 A1 | 9/2011 | Yamazaki et al. |
| 2011/0237025 A1 | 9/2011 | Yamazaki |
| 2011/0256684 A1 | 10/2011 | Iwasaki et al. |
| 2011/0260121 A1 | 10/2011 | Yano et al. |
| 2011/0298039 A1 | 12/2011 | Matsuo et al. |
| 2012/0119205 A1 | 5/2012 | Taniguchi et al. |
| 2012/0220077 A1 | 8/2012 | Ha et al. |

FOREIGN PATENT DOCUMENTS

| | | |
|---|---|---|
| EP | 1737044 A | 12/2006 |
| EP | 1950177 A | 7/2008 |
| EP | 2144294 A | 1/2010 |
| EP | 2157615 A | 2/2010 |
| EP | 2226847 A | 9/2010 |
| EP | 2339639 A | 6/2011 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-257739 A | 9/2003 |
| JP | 2004-103957 A | 4/2004 |
| JP | 2004-273614 A | 9/2004 |
| JP | 2004-273732 A | 9/2004 |
| JP | 2006-041127 A | 2/2006 |
| JP | 2006-165528 A | 6/2006 |
| JP | 2007-073701 A | 3/2007 |
| JP | 2007-073705 A | 3/2007 |
| JP | 2007-103918 A | 4/2007 |
| JP | 2007-201366 A | 8/2007 |
| JP | 2007-250983 A | 9/2007 |
| JP | 2007-305658 A | 11/2007 |
| JP | 2008-141119 A | 6/2008 |
| JP | 2008-218495 A | 9/2008 |
| JP | 2009-031750 A | 2/2009 |
| JP | 2009-141002 A | 6/2009 |
| JP | 2009-194351 A | 8/2009 |
| JP | 2009-212476 A | 9/2009 |
| JP | 2009-224479 A | 10/2009 |
| JP | 2009-224737 A | 10/2009 |
| JP | 2009-231613 A | 10/2009 |
| JP | 2009-260002 A | 11/2009 |
| JP | 2009-277701 A | 11/2009 |
| JP | 2009-277858 A | 11/2009 |
| JP | 2010-016347 A | 1/2010 |
| JP | 2010-021520 A | 1/2010 |
| JP | 2010-034343 A | 2/2010 |
| JP | 2010-034534 A | 2/2010 |
| JP | 2010-040552 A | 2/2010 |
| JP | 2010-067954 A | 3/2010 |
| JP | 2010-074138 A | 4/2010 |
| KR | 2010-0005900 A | 1/2010 |
| TW | 200845397 | 11/2008 |
| TW | 200901481 | 1/2009 |
| WO | WO-2004/114391 | 12/2004 |
| WO | WO-2007/029844 | 3/2007 |
| WO | WO-2007/058248 | 5/2007 |
| WO | WO-2007/086291 | 8/2007 |
| WO | WO-2007/119386 | 10/2007 |
| WO | WO-2008/069286 | 6/2008 |
| WO | WO-2008/105250 | 9/2008 |
| WO | WO-2008/105347 | 9/2008 |
| WO | WO-2008/139859 | 11/2008 |
| WO | WO-2009/066750 | 5/2009 |
| WO | WO-2009/072532 | 6/2009 |
| WO | WO-2009/093625 | 7/2009 |
| WO | WO-2009/139428 | 11/2009 |
| WO | WO-2010/013621 | 2/2010 |
| WO | WO-2010/067571 | 6/2010 |

OTHER PUBLICATIONS

Zhao.J et al., "Bandgap-Engineered Ga-Rich GaZnO Thin Films for UV Transparent Electronics", IEEE Transactions on Electron Devices, Dec. 1, 2009, vol. 56, No. 12, pp. 2995-2999.

Yuan.L et al., "Optical and electrical characterization of a-InGaZnO thin film fabricated by pulsed laser deposition for thin film applications", Journal of Physics D: Applied Physics, vol 42, pp. 215301-1-215301-6, IOP Publishing Ltd.

Frank.J et al., "Electrical doping of gas-sensitive, semiconducting Ga2O3 thin films", Sensors and Actuators, Feb. 25, 1996, vol. B34, pp. 373-377, Elsevier Science.

International Search Report (Application No. PCT/JP2011/057266) dated Jun. 14, 2011.

Written Opinion (Application No. PCT/JP2011/057266) dated Jun. 14, 2011.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YbFe2O4, and Yb2Fe3O7 Types of Structures for Compounds in the In2O3 and Sc2O3—A2O3—BO systems [A; Fe, Ga, or Al; B: Mg, Mn, Fe, Ni, Cu, or Zn ] at temperatures over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol 116, No. 1, pp. 170-178.

(56) References Cited

OTHER PUBLICATIONS

Chern.H et al., "An Analytical Model for the Above-Threshold Characteristics of Polysilicon Thin-Film transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUs on Glass and Plastic Substrates Fabricated by TFT Transfer Technology", IEDM 05: Technical Digest of Internationl Electron Devices Meeting, Dec. 5, 2005, pp. 1067-1069.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "Suftla Flexible Microelectronics on Their Way to Business", SID Digest '07 : SID International Symposium Digest of Technical Papers, 2007, vol. 38, pp. 1673-1676.

Kurokawa.Y et al., "UHF RFCPUs on Flexible and Glass Substrates for Secure RFID Systems", Journal of Solid-State Circuits, 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display with Driver Circuit Using Amorphous In—Ga—Zn-Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technicial Papers, May 31, 2009, pp. 395-398.

Nowatari.H et al., "60.2: Intermediate Connector with Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5) Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technicial Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technicial Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn-Oxide TFTs with a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technicial Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

(56) References Cited

OTHER PUBLICATIONS

Clark.S et al., "First Principles Methods Using Castep", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90. No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 with Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nakayama et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.

Ono.M et al., "Novel High Performance IGZO-TFT with High Mobility over 40 cm2/Vs and High Photostability Incorporated Oxygen Diffusion", IDW '11 : Proceedings of the 18th International Display Workshops, Dec. 7, 2011, pp. 1689-1690.

Jeon.S et al., "180nm Gate Length Amorphous InGaZnO Thin Film Transistor for High Density Image Sensor Applications", IEDM 10: Technical Digest of International Electron Devices Meeting, Dec. 6, 2010, pp. 504-507.

Gallium oxide trumps traditional wide bandgap semiconductors, http://www.compoundsemiconductor.net/article/89570-gallium-oxide-trumps-traditional-wide-bandgap-semiconductors.html.

Sileo.C, "Characterization of InGaZnO thin films for flexible electronics", College of Engineering, University of Florida Bachelors of Science in Materials Science and Engineering Undergraduate Honors Thesis Spring 2013, 2013, University of Florida.

Taiwanese Office Action (Application No. 100109716) dated Mar. 10, 2016.

Taiwanese Office Action (Application No. 106117948) dated Nov. 3, 2017.

* cited by examiner

METAL OXIDE SEMICONDUCTOR DEVICE

CROSS-REFERENCE TO RELATED APPLICATIONS

This application is a continuation of U.S. application Ser. No. 14/690,533, filed Apr. 20, 2015, now allowed, which is a continuation of U.S. application Ser. No. 13/913,601, filed Jun. 10, 2013, now U.S. Pat. No. 9,012,908, which is a continuation of U.S. application Ser. No. 13/071,802, filed Mar. 25, 2011, now U.S. Pat. No. 8,461,584, which claims the benefit of a foreign priority application filed in Japan as Serial No. 2010-072256 on Mar. 26, 2010, all of which are incorporated by reference.

TECHNICAL FIELD

An embodiment of the present invention relates to a semiconductor device and a method for manufacturing the semiconductor device.

In this specification, a semiconductor device generally means a device which can function by utilizing semiconductor characteristics, and an electro-optic device, a semiconductor circuit, and an electronic device are all semiconductor devices.

BACKGROUND ART

Attention has been focused on a technique for forming a transistor (also referred to as a thin film transistor (TFT)) using a semiconductor thin film formed over a substrate having an insulating surface. Such a transistor is applied to a wide range of electronic devices such as an integrated circuit (IC) or an image display device (display device). As a semiconductor thin film applicable to the transistor, a silicon based semiconductor material is widely known. Moreover, an oxide semiconductor has been attracting attention as another material.

For example, a transistor whose active layer includes an amorphous oxide containing indium (In), gallium (Ga), and zinc (Zn) and having an electron carrier concentration of less than $10^{18}/cm^3$ is disclosed (see Patent Document 1).

REFERENCE

Patent Document

[Patent Document 1] Japanese Published Patent Application No. 2006-165528

DISCLOSURE OF INVENTION

However, the electric conductivity of an oxide semiconductor changes when deviation from the stoichiometric composition due to excess or deficiency of oxygen or the like occurs, or hydrogen or moisture forming an electron donor enters the oxide semiconductor during a thin film formation process. Such a phenomenon becomes a factor of variation in the electric characteristics of a transistor including the oxide semiconductor.

In view of the above problems, it is an object to provide a semiconductor device including an oxide semiconductor, which has stable electric characteristics and high reliability.

In addition, it is an object to prevent generation of a parasitic channel on the back channel side of an oxide semiconductor film.

In order to suppress variation in the electric characteristics of a transistor including an oxide semiconductor film, impurities such as hydrogen, moisture, a hydroxyl group, or hydride (also referred to as a hydrogen compound) which cause the variation are intentionally removed from the oxide semiconductor film. In addition, oxygen which is a main component of an oxide semiconductor and is reduced in the step of removing the impurities is supplied. The oxide semiconductor film is thus highly purified and becomes electrically i-type (intrinsic).

An i-type (intrinsic) oxide semiconductor is an oxide semiconductor which is made to be i-type (intrinsic) or substantially i-type (intrinsic) by being highly purified by removing hydrogen, which is an n-type impurity, from the oxide semiconductor so that impurities that are not a main component of the oxide semiconductor are contained as little as possible. In other words, a feature is that a highly purified i-type (intrinsic) oxide semiconductor or an oxide semiconductor close thereto is obtained not by adding impurities but by removing impurities such as hydrogen or water as much as possible. This enables the Fermi level (Ef) to be at the same level as the intrinsic Fermi level (Ei).

In a transistor including an oxide semiconductor film, an oxide layer having a function of preventing electrification is formed over and in contact with the oxide semiconductor film, and then, heat treatment is performed.

The oxide layer having a function of preventing electrification is preferably formed on the back channel side (the side opposite to the gate insulating film side) of the oxide semiconductor film, preferably, the highly purified oxide semiconductor film. In addition, the oxide layer having a function of preventing electrification preferably has a dielectric constant lower than that of the oxide semiconductor. For example, an oxide layer having a dielectric constant of 8 to 20 inclusive may be used.

The oxide layer is thicker than the oxide semiconductor film. For example, provided that the thickness of the oxide semiconductor film is 3 nm to 30 nm inclusive, the thickness of the oxide layer is preferably more than 10 nm and more than or equal to the thickness of the oxide semiconductor film.

A metal oxide can be used for the oxide layer. As the metal oxide, for example, gallium oxide or gallium oxide to which indium or zinc is added at 0.01 at. % to 5 at. % can be used.

The oxide semiconductor film is preferably highly purified by intentionally removing impurities such as hydrogen, moisture, a hydroxyl group, or hydride (also referred to as a hydrogen compound) through the heat treatment. Hydrogen or a hydroxyl group which is an impurity can be easily eliminated as water in the heat treatment.

The oxide semiconductor film and the metal oxide film containing oxygen are in contact with each other when being subjected to the heat treatment; thus, oxygen which is one of the main components of the oxide semiconductor and is reduced in the step of removing impurities, can be supplied from the metal oxide film containing oxygen to the oxide semiconductor film. Thus, the oxide semiconductor film is more highly purified to become electrically i-type (intrinsic).

Further, in order to prevent entry of impurities such as moisture or hydrogen into the oxide semiconductor film after the heat treatment, a protective insulating layer which prevents entry thereof from the outside may be further formed over the metal oxide film.

The electric characteristics of the transistor including the highly purified oxide semiconductor film, such as the threshold voltage and the off-state current, have almost no temperature dependence. Further, the transistor characteristics hardly change owing to light deterioration.

As described above, variation in the electric characteristics of the transistor including the highly purified and electrically i-type (intrinsic) oxide semiconductor film is suppressed and the transistor is electrically stable. Consequently, a highly reliable semiconductor device including an oxide semiconductor, which has stable electric characteristics, can be provided.

The heat treatment is performed at a temperature of 250° C. to 650° C. inclusive, 450° C. to 600° C. inclusive, or less than the strain point of a substrate. The heat treatment may be performed in an atmosphere of nitrogen, oxygen, ultra-dry air (air in which the water content is 20 ppm or less, preferably 1 ppm or less, more preferably 10 ppb or less), or a rare gas (argon, helium, or the like).

According to an embodiment of the structure of the invention disclosed in this specification, a semiconductor device includes: a gate electrode, a gate insulating film which covers the gate electrode, an oxide semiconductor film in a region overlapping with the gate electrode over the gate insulating film, a source electrode and a drain electrode which are in contact with the oxide semiconductor film, and a metal oxide film which is contact with the oxide semiconductor film and covers the source electrode and the drain electrode.

In the above device, a gallium oxide film is preferably used as the metal oxide film. The gallium oxide film can be formed by a sputtering method, a CVD method, an evaporation method, or the like. The gallium oxide film has a band gap of about 4.9 eV and a light-transmitting property in the visible-light wavelength range, although depending on the composition ratio of oxygen and gallium.

In this specification, gallium oxide is represented by $GaO_x$ (x>0) in some cases. For example, when $GaO_x$ has a crystal structure, $Ga_2O_3$ in which x is 1.5 is known.

In the above device, the metal oxide film is preferably a gallium oxide film containing indium or zinc at 0.01 at. % to 5 at. %. In addition, the difference between the band gap of the metal oxide film and the band gap of the oxide semiconductor film is preferably less than 3.0 eV.

In addition, the oxide semiconductor film preferably contains indium and gallium.

In addition, in the above device, the source electrode and the drain electrode preferably contain a conductive material whose work function is 3.9 eV or more. The conductive material whose work function is 3.9 eV or more is preferably tungsten nitride or titanium nitride.

In addition, according to another embodiment of the invention disclosed in this specification, a method for manufacturing a semiconductor device includes the steps of: forming a gate electrode over a substrate, forming a gate insulating film which covers the gate electrode, forming an oxide semiconductor film in a region overlapping with the gate electrode with the gate insulating film interposed therebetween, forming a source electrode and a drain electrode over the oxide semiconductor film, forming a metal oxide film which covers the oxide semiconductor film, the source electrode, and the drain electrode, and performing heat treatment.

In the above method, a film containing gallium oxide is preferably formed as the metal oxide film. In addition, a gallium oxide film containing indium or zinc at 0.01 at. % to 5 at. % is preferably formed as the metal oxide film. In addition, the heat treatment is preferably performed at a temperature of 450° C. to 600° C.

According to an embodiment of the present invention, a metal oxide film is formed over and in contact with an oxide semiconductor film, and then, heat treatment is performed. Through the heat treatment, impurities such as hydrogen, moisture, a hydroxyl group, or hydride can be intentionally removed from the oxide semiconductor film, whereby the oxide semiconductor film can be highly purified. Variation in the electric characteristics of a transistor including the highly purified and electrically i-type (intrinsic) oxide semiconductor film is suppressed and the transistor is electrically stable.

Therefore, according to an embodiment of the present invention, a transistor having stable electric characteristics can be manufactured.

In addition, according to an embodiment of the present invention, a semiconductor device including a transistor, which has favorable electric characteristics and high reliability, can be manufactured.

BEST MODE FOR CARRYING OUT THE INVENTION

Hereinafter, embodiments of the present invention will be described in detail with reference to the accompanying drawings. However, the present invention is not limited to the description below, and it is easily understood by those skilled in the art that modes and details disclosed herein can be modified in various ways. Therefore, the present invention is not construed as being limited to the description of the embodiments below.

Note that the ordinal numbers such as "first" and "second" in this specification are used for convenience and do not denote the order of steps and the stacking order of layers. In addition, the ordinal numbers in this specification do not denote particular names which specify the invention.

(Embodiment 1)

In this embodiment, an embodiment of a semiconductor device and a method for manufacturing the semiconductor device will be described with reference to FIGS. 1A to 1D. In this embodiment, a transistor including an oxide semiconductor film will be described as an example of the semiconductor device.

Figure 1A:
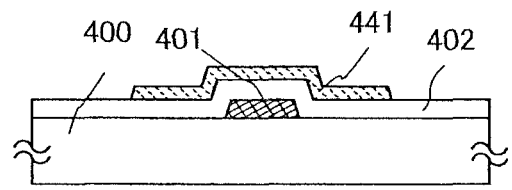
FIGS. 1A to 1D are diagrams illustrating an embodiment of a semiconductor device and a method for manufacturing the semiconductor device.
Figure 1B:
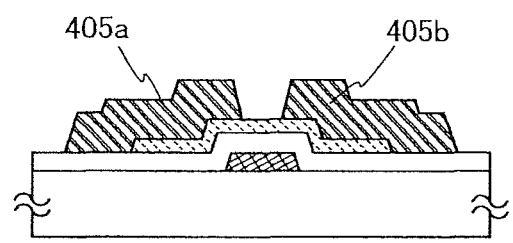
Figure 1C:
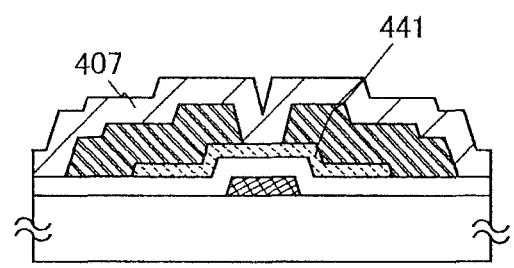
Figure 1D:
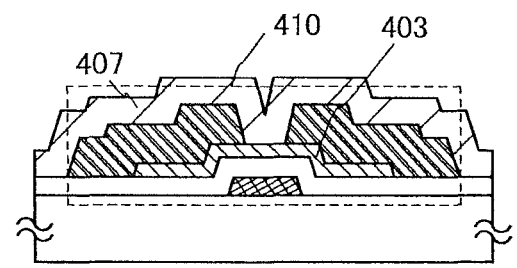

As illustrated in FIG. 1D, a transistor 410 includes, over a substrate 400 having an insulating surface, a gate electrode 401, a gate insulating film 402, an oxide semiconductor film 403, a source electrode 405a, and a drain electrode 405b. A metal oxide film 407 having a function of preventing electrification on the back channel side of the oxide semiconductor film 403 is provided over the oxide semiconductor film 403.

FIGS. 1A to 1D illustrate an example of a method for manufacturing the transistor 410.

First, a conductive film is formed over the substrate 400 having an insulating surface, and then, the gate electrode 401 is formed by a first photolithography step. Note that a resist mask may be formed by an inkjet method. Formation of the resist mask by an inkjet method needs no photomask; thus, manufacturing cost can be reduced.

Although there is no particular limitation on a substrate which can be used as the substrate 400 having an insulating surface, it is necessary that the substrate have at least enough heat resistance to a heat treatment to be performed later. For example, a substrate such as a glass substrate, a ceramic substrate, a quartz substrate, or a sapphire substrate can be used. In addition, a single crystal semiconductor substrate or a polycrystalline semiconductor substrate of silicon, silicon carbide, or the like, a compound semiconductor substrate of silicon germanium, or the like, an SOI substrate, or the like can be used as long as the substrate has an insulating surface. The transistor 410 may be provided over such a substrate.

Further, a flexible substrate may be used as the substrate 400. In the case where a flexible substrate is used, the transistor 410 including the oxide semiconductor film 403 may be directly formed over a flexible substrate. Alternatively, the transistor 410 including the oxide semiconductor film 403 may be formed over a manufacturing substrate, and then, the transistor 410 may be separated from the manufacturing substrate and transferred to a flexible substrate. Note that in order to separate the transistor from the manufacturing substrate and transfer it to the flexible substrate, a separation layer may be provided between the manufacturing substrate and the transistor including the oxide semiconductor film.

Note that an insulating film serving as a base film may be provided between the substrate 400 and the gate electrode 401. The base film has a function of preventing diffusion of impurity elements from the substrate 400, and can be formed using one or more of a silicon nitride film, a silicon oxide film, a silicon nitride oxide film, and a silicon oxynitride film.

In addition, the gate electrode 401 can be formed to have a single-layer structure or a stack-layer structure using a metal material such as molybdenum, titanium, tantalum, tungsten, aluminum, copper, neodymium, or scandium, or an alloy material which contains any of these materials as a main component.

Next, the gate insulating film 402 is formed over the gate electrode 401. The gate insulating film 402 can be formed using one or more of a silicon oxide film, a silicon nitride film, a silicon oxynitride film, a silicon nitride oxide film, an aluminum oxide film, an aluminum nitride film, an aluminum oxynitride film, an aluminum nitride oxide film, and a hafnium oxide film by a plasma CVD method, a sputtering method, or the like.

The oxide semiconductor film 403 in this embodiment is formed using an intrinsic (i-type) or substantially intrinsic (i-type) oxide semiconductor from which impurities are removed and which is highly purified so as to contain an impurity that serves as a carrier donor and is a substance other than the main component of the oxide semiconductor as little as possible. Specifically, the hydrogen concentration in the oxide semiconductor film 403 is $5 \times 10^{19}$ atoms/cm$^3$ or less, preferably $5 \times 10^{18}$ atoms/cm$^3$ or less, more preferably $5 \times 10^{17}$ atoms/cm$^3$ or less. Note that the hydrogen concentration in the oxide semiconductor film 403 is measured by secondary ion mass spectroscopy (SIMS). In the oxide semiconductor film 403 which is highly purified by sufficiently reducing the hydrogen concentration and in which defect levels in an energy gap due to oxygen deficiency are reduced by supplying a sufficient amount of oxygen, the carrier concentration is less than $1 \times 10^{12}$ /cm$^3$, preferably less than $1 \times 10^{11}$ /cm$^3$, more preferably less than $1.45 \times 10^{10}$ /cm$^3$. For example, the off-state current (here, current per micrometer (μm) of channel width) at room temperature (25° C.) is 100 zA (1 zA (zeptoampere) is $1 \times 10^{-21}$ A) or less, preferably 10 zA or less. The transistor 410 with excellent off-state current characteristics can be obtained with the use of an i-type (intrinsic) or substantially i-type oxide semiconductor.

Such a highly purified oxide semiconductor is highly sensitive to an interface state or interface charge; thus, an interface between the oxide semiconductor film and the gate insulating film is important. Thus, the gate insulating film that is to be in contact with the highly purified oxide semiconductor needs to have high quality.

For the method for manufacturing the gate insulating film, a high-density plasma CVD method using microwaves (e.g., with a frequency of 2.45 GHz) is preferably employed because an insulating layer which is formed can be dense and can have high breakdown voltage and high quality. When the highly purified oxide semiconductor and the high-quality gate insulating film are in close contact with each other, the interface state density can be reduced and favorable interface characteristics can be obtained.

Needless to say, a different film formation method such as a sputtering method or a plasma CVD method can be used as long as a high-quality insulating film can be formed as the gate insulating film. In addition, an insulating film can be used, whose film quality as the gate insulating film and characteristics of an interface with the oxide semiconductor are modified by heat treatment performed after formation of the oxide semiconductor film. In any case, any insulating film can be used as long as film quality as the gate insulating film is favorable, interface state density with the oxide semiconductor is decreased, and a favorable interface can be formed.

In order that hydrogen, a hydroxyl group, and moisture are contained as little as possible in the gate insulating film 402 and the oxide semiconductor film, it is preferable that the substrate 400 over which the gate electrode 401 is formed or the substrate 400 over which films up to the gate insulating film 402 are formed be preheated in a preheating chamber of a sputtering apparatus as pretreatment for the formation of the oxide semiconductor film, so that impurities such as hydrogen or moisture absorbed onto the substrate 400 are eliminated and removed. As an evacuation unit provided in the preheating chamber, a cryopump is preferable. Note that this preheating treatment can be omitted. In addition, this preheating treatment may be performed on the substrate 400 over which films up to the source electrode 405a and the drain electrode 405b are formed (before forming the metal oxide film 407) in a later step in a similar manner.

Next, an oxide semiconductor film having a thickness of 3 nm to 30 nm inclusive is formed over the gate insulating film 402 by a sputtering method. The thickness in the above range is preferable because when the thickness of the oxide semiconductor film is too large (for example, when the thickness is 50 nm or more), the transistor might be normally on.

Note that before the oxide semiconductor film is formed by a sputtering method, powdery substances (also referred to as particles or dusts) which are attached on a surface of the gate insulating film 402 are preferably removed by reverse sputtering in which an argon gas is introduced and plasma is generated. The reverse sputtering refers to a method in which, without application of a voltage to a target side, an RF power source is used for application of a voltage to a substrate side in an argon atmosphere to generate plasma in the vicinity of the substrate and modify a surface. Note that instead of an argon atmosphere, a nitrogen atmosphere, a helium atmosphere, an oxygen atmosphere, or the like may be used.

As an oxide semiconductor used for the oxide semiconductor film, the following oxide semiconductors can be used: a four-component metal oxide such as an In—Sn—Ga—Zn—O based oxide semiconductor; a three-component metal oxide such as an In—Ga—Zn—O based oxide semiconductor, an In—Sn—Zn—O based oxide semiconductor, an In—Al—Zn—O based oxide semiconductor, a Sn—Ga—Zn—O based oxide semiconductor, an Al—Ga—Zn—O based oxide semiconductor, or a Sn—Al—Zn—O based oxide semiconductor, a two-component metal oxide such as an In—Zn—O based oxide semiconductor, a Sn—Zn—O based oxide semiconductor, an Al—Zn—O based oxide semiconductor, a Zn—Mg—O based oxide semiconductor, a Sn—Mg—O based oxide semiconductor, an In—Mg—O based oxide semiconductor, or an In—Ga—O based oxide semiconductor, an In—O based oxide semiconductor, a Sn—O based oxide semiconductor, or a Zn—O based oxide semiconductor, and the like. Further, $SiO_2$ may be contained in the above oxide semiconductor. Note that here, for example, an In—Ga—Zn—O based oxide semiconductor means an oxide semiconductor containing indium (In), gallium (Ga), and zinc (Zn) and there is no particular limitation on the composition ratio. The In—Ga—Zn—O based oxide semiconductor may contain an element other than In, Ga, and Zn.

In addition, for the oxide semiconductor film, a thin film of a material represented by the chemical formula, $InMO_3(ZnO)_m$ (m>0), can be used. Here, M represents one or more metal elements selected from Ga, Al, Mn, and Co. For example, M can be Ga, Ga and Al, Ga and Mn, Ga and Co, or the like.

When an In—Ga—Zn—O based material is used as an oxide semiconductor, for example, an oxide target having a composition ratio of $In_2O_3:Ga_2O_3:ZnO=1:1:1$ [molar ratio] can be used. In addition, without limitation to the material and the component of this target, for example, an oxide target having a composition ratio of $In_2O_3:Ga_2O_3:ZnO=1:1:2$ [molar ratio] may be used.

When an In—Zn—O based material is used as an oxide semiconductor, a target to be used has a composition ratio of In:Zn=50:1 to 1:2 in an atomic ratio ($In_2O_3:ZnO=25:1$ to 1:4 in a molar ratio), preferably In:Zn=20:1 to 1:1 in an atomic ratio ($In_2O_3:ZnO=10:1$ to 1:2 in a molar ratio), more preferably In:Zn=15:1 to 1.5:1 in an atomic ratio ($In_2O_3:ZnO=15:2$ to 3:4 in a molar ratio). For example, in a target used for formation of an In—Zn—O based oxide semiconductor which has an atomic ratio of In:Zn:O=X:Y:Z, an inequality of Z>1.5X+Y is satisfied.

Furthermore, the filling rate of the target is 90% to 100% inclusive, preferably 95% to 99.9% inclusive. With the use of the target with a high filling rate, a dense oxide semiconductor film can be formed.

In this embodiment, the oxide semiconductor film is formed by a sputtering method with the use of an In—Ga—Zn—O based oxide target. Alternatively, the oxide semiconductor film can be formed by a sputtering method in a rare gas (typically, argon) atmosphere, an oxygen atmosphere, or a mixed atmosphere containing a rare gas and oxygen.

It is preferable to use a high-purity gas from which impurities such as hydrogen, water, a hydroxyl group, or hydride are removed, as a sputtering gas used when the oxide semiconductor film is formed.

For the formation of the oxide semiconductor film, the substrate 400 is set in a film formation chamber at reduced pressure and the substrate temperature is set to 100° C. to 600° C. inclusive, preferably 200° C. to 400° C. inclusive. When film formation is performed while the substrate 400 is heated, the concentration of impurities contained in the oxide semiconductor film can be reduced. In addition, damage by sputtering can be reduced. Then, residual moisture in the film formation chamber is removed, a sputtering gas from which hydrogen and moisture are removed is introduced, and the above-described target is used, so that the oxide semiconductor film is formed over the substrate 400. In order to remove moisture remaining in the film formation chamber, an entrapment vacuum pump such as a cryopump, an ion pump, or a titanium sublimation pump is preferably used. The evacuation unit may be a turbo pump provided with a cold trap. In the film formation chamber which is evacuated with a cryopump, for example, a hydrogen atom, a compound containing a hydrogen atom, such as water ($H_2O$), (preferably, also a compound containing a carbon atom), and the like are removed, whereby the concentration of impurities in the oxide semiconductor film formed in the film formation chamber can be reduced.

As one example of the film formation condition, the distance between the substrate and the target is 100 mm, the pressure is 0.6 Pa, the electric power of a direct-current (DC) power source is 0.5 kW, and the atmosphere is an oxygen atmosphere (the proportion of the oxygen flow is 100%). Note that a pulse direct-current power source is preferably used, in which case powder substances (also referred to as particles or dusts) that are generated in film formation can be reduced and the film thickness can be uniform.

Next, the oxide semiconductor film is processed into an island-shaped oxide semiconductor film 441 by a second photolithography step (see FIG. 1A). A resist mask for forming the island-shaped oxide semiconductor film 441 may be formed by an inkjet method. Formation of the resist mask by an inkjet method needs no photomask; thus, manufacturing cost can be reduced. In the above manner, the oxide semiconductor film in a region overlapping with the gate electrode can be formed over the gate insulating film.

Note that the etching of the oxide semiconductor film may be dry etching, wet etching, or both dry etching and wet etching. As an etchant used for wet etching of the oxide semiconductor film, a mixed solution of phosphoric acid, acetic acid, and nitric acid, or the like can be used, for example. In addition, ITO07N (produced by KANTO CHEMICAL CO., INC.) may be used.

Next, a conductive film for forming the source electrode and the drain electrode (including a wiring formed in the same layer as the source electrode and the drain electrode) is formed over the gate insulating film 402 and the oxide semiconductor film 441. As the conductive film for forming the source electrode and the drain electrode, for example, a metal film containing an element selected from Al, Cr, Cu, Ta, Ti, Mo, and W, a metal nitride film containing any of the above elements as its component (e.g., a titanium nitride film, a molybdenum nitride film, or a tungsten nitride film), or the like can be used. Alternatively, a film of a high-melting-point metal such as Ti, Mo, or W or a metal nitride film thereof (e.g., a titanium nitride film, a molybdenum nitride film, or a tungsten nitride film) may be formed over or/and below a metal film such as an Al film or a Cu film. Alternatively, the conductive film for forming the source electrode and the drain electrode may be formed using a conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$; abbreviated to ITO), an indium oxide-zinc oxide alloy ($In_2O_3$—ZnO), or any of these metal oxide materials in which silicon oxide is contained can be used.

Note that it is preferable that a material of the source electrode and the drain electrode be selected in consideration of the electron affinity of the oxide semiconductor and the electron affinity of the metal oxide film. That is, when the work function of the material of the source electrode and the drain electrode is W [eV], the electron affinity of the oxide semiconductor is $\varphi_1$ [eV], and the electron affinity of the metal oxide film is $\varphi_2$ [eV], it is preferable that the following inequality be satisfied: $\varphi_2+0.4<W<(\varphi_1+0.5)$, preferably $(\varphi_2+0.9)<W<(\varphi_1+0.4)$. For example, when a material whose electron affinity is 4.5 eV and a material whose electron affinity is 3.5 eV are used for the oxide semiconductor and the metal oxide film respectively, a metal or a metal compound whose work function is more than 3.9 eV and less than 5.0 eV, preferably more than 4.4 eV and less than 4.9 eV is preferably used for the material of the source electrode and the drain electrode. Thus, in the transistor 410, electrons can be prevented from being injected into the metal oxide film 407 from the source electrode 405a and the drain electrode 405b, and generation of leakage current can be suppressed. In addition, favorable electric characteristics can be obtained at a junction between the oxide semiconductor film and the source and drain electrodes. For a material having such a work function, molybdenum nitride, tungsten nitride, or the like can be given, for example. These materials are preferable because they are also excellent in heat resistance. Note that from the above inequality, an inequality $\varphi_2<(\varphi_1+0.1)$, preferably an inequality $\varphi_2<(\varphi_1-0.5)$ is derived, but it is more preferable that an inequality $\varphi_2<(\varphi_1-0.9)$ be satisfied.

A resist mask is formed over the conductive film for forming the source electrode and the drain electrode by a third photolithography step. Etching is selectively performed, so that the source electrode 405a and the drain electrode 405b are formed. Then, the resist mask is removed (see FIG. 1B).

Light exposure at the time of the formation of the resist mask in the third photolithography step may be performed using ultraviolet light, KrF laser light, or ArF laser light. The channel length L of the transistor to be formed later is determined by a distance between a lower end of the source electrode 405a and a lower end of the drain electrode 405b that are adjacent to each other over the oxide semiconductor film 441. In the case where light exposure is performed for a channel length L of less than 25 nm, the light exposure at the time of the formation of the resist mask in the third photolithography step may be performed using extreme ultraviolet light having an extremely short wavelength of several nanometers to several tens of nanometers. In the light exposure using extreme ultraviolet light, the resolution is high and the focus depth is large. For these reasons, the channel length L of the transistor to be formed later can be 10 nm to 1000 nm inclusive, and the circuit can operate at higher speed.

In order to reduce the number of photomasks and the number of steps in photolithography, an etching step may be performed with the use of a resist mask formed using a multi-tone mask which is a light-exposure mask through which light is transmitted to have a plurality of intensities. A resist mask formed with the use of a multi-tone mask has a plurality of thicknesses and further can be changed in shape by etching; therefore, the resist mask can be used in a plurality of etching steps for processing into different patterns. Therefore, a resist mask corresponding to at least two kinds of different patterns can be formed by using one multi-tone mask. Thus, the number of light-exposure masks can be reduced and the number of corresponding photolithography steps can also be reduced, whereby simplification of a process can be realized.

Note that it is preferable that etching conditions be optimized so as not to etch and divide the oxide semiconductor film 441 when the conductive film for forming the source electrode and the drain electrode is etched. However, it is difficult to obtain etching conditions in which only the conductive film is etched and the oxide semiconductor film 441 is not etched at all. In some cases, only part of the oxide semiconductor film 441 is etched when the conductive film is etched, so that an oxide semiconductor film having a groove portion (a recessed portion) is formed.

In this embodiment, since a Ti film is used as the conductive film for forming the source electrode and the drain electrode and an In—Ga—Zn—O based oxide semiconductor is used as the oxide semiconductor film 441, ammonium hydrogen peroxide (31 wt % hydrogen peroxide: 28 wt % ammonia water: water=5:2:2) is used as an etchant.

Next, by plasma treatment using a gas such as $N_2O$, $N_2$, or Ar, hydrogen, water, or the like adsorbed to a surface of an exposed portion of the oxide semiconductor film may be removed. In the case where plasma treatment is performed, the metal oxide film 407 in contact with part of the oxide semiconductor film 441 is preferably formed following the plasma treatment without exposure to the air.

Then, the metal oxide film 407 is formed, which covers the source electrode 405a and the drain electrode 405b and is in contact with part of the oxide semiconductor film 441 (see FIG. 1C). Note that the thickness of the metal oxide film 407 is made larger than that of the oxide semiconductor film 441. The metal oxide film 407 is in contact with the back channel side of the oxide semiconductor film 441, that is, part of the oxide semiconductor film 441 which is between the source electrode 405a and the drain electrode 405b. The metal oxide film 407 is a film removing charges accumulated at the interface with the oxide semiconductor film 441.

A positive charge is moved from the source electrode 405a or the drain electrode 405b to the oxide semiconductor film due to charges accumulated in the source electrode 405a or the drain electrode 405b, so that the interface at the back channel side of the oxide semiconductor film might be electrified. In particular, when the electric conductivity of an oxide semiconductor film and the electric conductivity of a material layer in contact with a back channel side of the oxide semiconductor film are different from each other, a charge flows to the oxide semiconductor film, and the charge is trapped at the interface and is bonded to hydrogen in the oxide semiconductor film to be a donor center of the interface. Consequently, there is a problem in that characteristics of a transistor vary. Therefore, both reduction of hydrogen and prevention of electrification in the oxide semiconductor film are important.

The difference between the band gap of the oxide semiconductor film and the band gap of the metal oxide film is preferably less than 3 eV. For example, in the case where an In—Ga—Zn—O based oxide semiconductor is used as the oxide semiconductor film and silicon oxide or aluminum oxide is used as the metal oxide film, since the band gap of the In—Ga—Zn—O based oxide semiconductor is 3.15 eV, and the band gap of silicon oxide or aluminum oxide is 8 eV, the above-described problem might occur. Further, when a film containing nitride (such as a silicon nitride film) is used instead of the metal oxide film, the electric conductivity of the oxide semiconductor film might change owing to a contact between the film containing nitride and the oxide semiconductor film.

The metal oxide film 407 is preferably a film having a property of removing a positive charge immediately, when the back channel side is positively charged. Note that as a material of the metal oxide film 407, a material whose hydrogen content is less than or equal to that of the oxide semiconductor film or is not larger than that of the oxide semiconductor film by an order of magnitude or more and whose energy gap is more than or equal to that of a material of the oxide semiconductor film is preferably used.

In an embodiment of the present invention, the case where gallium oxide, for example, GaOx (x>0) is used as the metal oxide film is described. The physical property values of gallium oxide are as follows. For example, the band gap is 3.0 eV to 5.2 eV (e.g., 4.9 eV), the dielectric constant is 8 to 20, and the electron affinity is 3.5 eV. The physical property values of the In—Ga—Zn—O based oxide semiconductor are as follows. For example, the band gap is 3.15 eV, the dielectric constant is 15, and the electron affinity is 3.5 eV. As described here, the difference between the physical property values of gallium oxide and the physical property values of the In—Ga—Zn—O based oxide semiconductor is small, which is preferable. Since gallium oxide has a wide band gap of about 4.9 eV, it has light-transmitting properties in a visible-light wavelength range. Further, it is preferable that gallium oxide be used as the metal oxide film because contact resistance between an In—Ga—Zn—O based oxide semiconductor film and a gallium oxide film can be reduced. In the case where gallium oxide is used as the metal oxide film, an In—Ga—O based oxide semiconductor or a Ga—Zn—O based oxide semiconductor may be used as the oxide semiconductor material in addition to the In—Ga—Zn—O based oxide semiconductor.

As described above, with the use of the metal oxide film having a function of preventing electrification, accumulation of charges at the back channel side of the oxide semiconductor film can be suppressed. Further, even when the back channel side of the oxide semiconductor film is positively charged, a positive charge can be removed immediately with the metal oxide film provided over a top surface of the oxide semiconductor film. Furthermore, with the use of the metal oxide film 407, generation of a parasitic channel on the back channel side of the oxide semiconductor film 403 can be prevented. Consequently, variation in the electric characteristics of the oxide semiconductor film, such as the electric conductivity, can be suppressed, whereby the reliability of the transistor can be improved.

A gallium oxide film is preferably used as the metal oxide film. The gallium oxide film can be formed by a sputtering method, a CVD method, an evaporation method, or the like. The gallium oxide film has a band gap of about 4.9 eV and has a light-transmitting property in the visible-light wavelength range, although depending on the composition ratio of oxygen and gallium.

In this specification, gallium oxide is represented by GaOx (x>0) in some cases. For example, when GaOx has a crystal structure, $Ga_2O_3$ in which x is 1.5 is known.

In this embodiment, a gallium oxide film obtained by a sputtering method using a pulse direct current (DC) power source is used as the metal oxide film 407. Note that a gallium oxide target is preferably used as a target used for a sputtering method. The electric conductivity of the metal oxide film 407 may be appropriately adjusted by adding indium or zinc to the metal oxide film 407, in accordance with the electric conductivity of the oxide semiconductor film which is used. For example, a film containing indium or zinc at 0.01 at. % to 5 at. % is formed by a sputtering method using a target obtained by adding indium or zinc to gallium oxide. When the electric conductivity of the metal oxide film 407 is improved and is brought close to the electric conductivity of the oxide semiconductor film 403 by adding indium or zinc, the accumulated charges can be more reduced.

In particular, in the case where an In—Ga—Zn—O film is used as the oxide semiconductor film, since the In—Ga—Zn—O film contains a gallium element which is common with GaOx used as the metal oxide film 407, a material of the oxide semiconductor film and a material of the metal oxide film are compatible with each other.

The metal oxide film 407 is preferably formed by using a method with which impurities such as water or hydrogen do not enter the metal oxide film 407. When hydrogen is contained in the metal oxide film 407, entry of hydrogen into the oxide semiconductor film or extraction of oxygen from the oxide semiconductor film by hydrogen is caused; thus, a back channel of the oxide semiconductor film might have low resistance (n-type conductivity) and a parasitic channel might be formed. Therefore, it is important that a formation method in which hydrogen is not used is employed such that the metal oxide film 407 contains as little hydrogen as possible.

In this embodiment, as the metal oxide film 407, a gallium oxide film having a thickness of more than 10 nm and more than or equal to that of the oxide semiconductor film 441 is formed by a sputtering method. This is because the metal oxide film 407 can remove a charge efficiently by increasing the thickness of the metal oxide film 407 to be more than or equal to that of the oxide semiconductor film 441 in such a manner. The substrate temperature at the time of film formation is room temperature to 300° C. inclusive. The gallium oxide film can be formed by a sputtering method in a rare gas (typically, argon) atmosphere, an oxygen atmosphere, or a mixed atmosphere containing a rare gas and oxygen.

In order to remove residual moisture from the film formation chamber of the metal oxide film 407 in a manner similar to that of the formation of the oxide semiconductor film, an entrapment vacuum pump (such as a cryopump) is preferably used. When the metal oxide film 407 is formed in the film formation chamber evacuated using a cryopump, the concentration of impurities contained in the metal oxide film 407 can be reduced. In addition, as an evacuation unit for removing the residual moisture from the film formation chamber of the metal oxide film 407, a turbo pump provided with a cold trap may be used.

It is preferable to use a high-purity gas from which impurities such as hydrogen, water, a hydroxyl group, or hydride are removed as a sputtering gas when the metal oxide film 407 is formed.

The metal oxide film 407 may cover at least the channel formation region of the oxide semiconductor film, the source electrode 405a, and the drain electrode 405b. If needed, the metal oxide film 407 may be selectively removed. Note that known wet etching or known dry etching can be used for etching of the gallium oxide film used in this embodiment. For example, wet etching is performed using a hydrofluoric acid solution or a nitric acid solution.

Next, the oxide semiconductor film 441 part of which (the channel formation region) is in contact with the metal oxide film 407 is subjected to heat treatment (see FIG. 1C).

The heat treatment is performed at a temperature of 250° C. to 650° C. inclusive, preferably 450° C. to 600° C. inclusive, or less than the strain point of the substrate. For example, the substrate is introduced into an electric furnace which is one of heat treatment apparatuses, and heat treatment is performed on the oxide semiconductor film at 450° C. for 1 hour in a nitrogen atmosphere.

Further, the heat treatment apparatus is not limited to an electric furnace, and a device for heating an object to be processed by heat conduction or heat radiation from a heating element such as a resistance heating element may be used. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used. Note that in the case where a GRTA apparatus is used as the heat treatment apparatus, the substrate may be heated in an inert gas heated to a high temperature of 650° C. to 700° C. because the heat treatment time is short.

The heat treatment may be performed in an atmosphere of nitrogen, oxygen, ultra-dry air (air in which the water content is 20 ppm or less, preferably 1 ppm or less, more preferably 10 ppb or less), or a rare gas (argon, helium, or the like). Note that it is preferable that water, hydrogen, or the like be not contained in the atmosphere of nitrogen, oxygen, ultra-dry air, or a rare gas. Alternatively, nitrogen, oxygen, or a rare gas which is introduced into the heat treatment apparatus has a purity of 6N (99.9999%) or more, preferably 7N (99.99999%) or more (that is, the impurity concentration is 1 ppm or less, preferably 0.1 ppm or less).

In addition, the oxide semiconductor film and the metal oxide film 407 containing oxygen are in contact with each other when being subjected to the heat treatment; thus, oxygen which is one of the main components of the oxide semiconductor and is reduced in the step of removing impurities, can be supplied from the metal oxide film 407 containing oxygen to the oxide semiconductor film. Consequently, a charge trapping center in the oxide semiconductor film can be reduced. Through the above steps, the oxide semiconductor film 403 which is highly purified and is made electrically i-type (intrinsic) can be obtained. In addition, impurities are removed from the metal oxide film 407 at the same time by this heat treatment, and the metal oxide film 407 can be highly purified.

The highly purified oxide semiconductor film 403 includes extremely few carriers derived from a donor. The carrier concentration of the oxide semiconductor film 403 is less than $1 \times 10^{14}/cm^3$, preferably less than $1 \times 10^{12}/cm^3$, more preferably less than $1 \times 10^{11}/cm^3$.

Through the above-described steps, the transistor 410 is formed (see FIG. 1D). The transistor 410 is a transistor including the oxide semiconductor film 403 which is highly purified and from which impurities such as hydrogen, moisture, a hydroxyl group, or hydride (also referred to as a hydrogen compound) are intentionally removed. Therefore, variation in the electric characteristics of the transistor 410 is suppressed and the transistor 410 is electrically stable.

The other heat treatment may be performed in addition to the above heat treatment. For example, heat treatment (first heat treatment) may be performed after the oxide semiconductor film 441 is formed, and heat treatment (second heat treatment) may be further performed after the metal oxide film 407 is formed. In this case, the first heat treatment can be treatment in which heating is performed in an inert gas atmosphere and cooling is performed in an oxygen atmosphere (in an atmosphere at least containing oxygen), for example. When such first heat treatment is used, dehydration and supply of oxygen can be favorably performed on the oxide semiconductor film.

After the second heat treatment, heat treatment may be further performed. For example, heat treatment may be performed at 100° C. to 200° C. inclusive in the air for 1 hour to 30 hours inclusive. This heat treatment may be performed at a fixed heating temperature. Alternatively, the following change in the heating temperature may be conducted plural times repeatedly: the heating temperature is increased from a room temperature to a temperature of 100° C. to 200° C. inclusive and then decreased to a room temperature.

In addition, in the transistor 410 including the oxide semiconductor film 403, relatively high field-effect mobility can be obtained, whereby high-speed operation is possible. Consequently, when the above transistor is used in a pixel portion, high-quality images can be obtained. In addition, since a driver circuit portion and a pixel portion each including the transistor including the highly purified oxide semiconductor film can be formed over one substrate, the number of components of the semiconductor device can be reduced.

In the transistor 410 including the metal oxide film 407, generation of a parasitic channel on the back channel side of the oxide semiconductor film 403 can be prevented. By preventing the generation of a parasitic channel on the back channel side of the oxide semiconductor film 403 in the transistor 410, variation in the threshold voltage can be suppressed, whereby the reliability of the transistor can be improved.

Figure 9A:
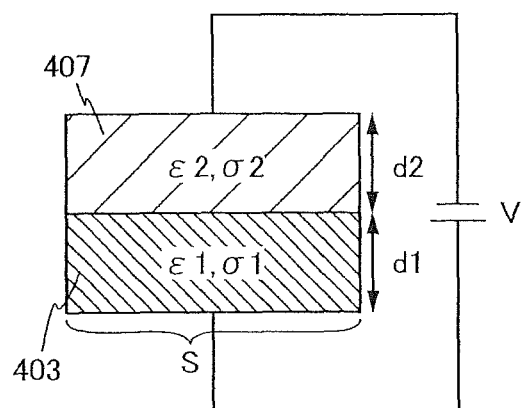
FIG. 9A is a model diagram illustrating a stacked-layer structure of dielectrics and FIG. 9B is an equivalent circuit diagram.
Figure 9B:
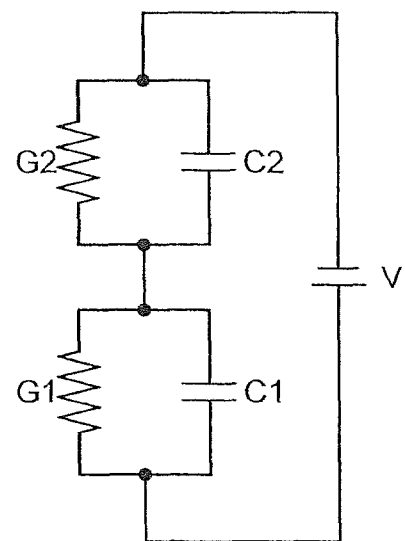

In the transistor 410 illustrated in FIG. 1D, two dielectric layers, the oxide semiconductor film 403 and the metal oxide film 407, are provided in contact with each other. In the case where two different dielectric layers are stacked, the stacked two layers can be expressed as in a model diagram in FIG. 9A when the dielectric constant, the electric conductivity, and the thickness of a first layer (the oxide semiconductor film 403 in the transistor 410) are set to $\in_1$, $\sigma_1$, and $d_1$ respectively, and the dielectric constant, the electric conductivity, and the thickness of a second layer (the metal oxide film 407 in the transistor 410) are set to $\in_2$, $\sigma_2$, and $d_2$ respectively. Note that in FIG. 9A, S represents an area. The model diagram in FIG. 9A can be replaced with an equivalent circuit in FIG. 9B. $C_1$, $G_1$, $C_2$, and $G_2$ in the drawing represent the capacitance value of the first layer, the resistance value of the first layer, the capacitance value of the second layer, and the resistance value of the second layer, respectively. Here, it is considered that in the case where a voltage V is applied to the two layers, a charge Q expressed by the following equation (1) is accumulated at the interface between the two layers after t seconds.

$$Q = \frac{C_2 G_1 - C_1 G_2}{G_1 + G_2} V \times \left\{ 1 - \exp\left(-\frac{G_1 + G_2}{C_1 + C_2}\right) \right\} \quad (1)$$

In the transistor 410 illustrated in FIG. 1D, the interface at which the charge Q is accumulated corresponds to the back channel side of the oxide semiconductor film 403. The charge Q accumulated at the interface on the back channel side can be decreased by appropriately setting the dielectric constant, the electric conductivity, or the thickness of the metal oxide film 407.

Here, the equation (1) is modified into equations (2) and (3).

$$Q = \left(1 - \frac{\tau_1}{\tau_2}\right) C_2 V_2 \times \left\{ 1 - \exp\left(-\frac{t}{\tau_i}\right) \right\} \quad (2)$$

$$V_2 = \frac{G_1}{G_1 + G_2} V \quad (3)$$

$$\left(\text{Not that } C_1 = \frac{\varepsilon_1}{d_1} S, C_2 = \frac{\varepsilon_2}{d_2} S, G_1 = \frac{\sigma_1}{d_1} S,\right.$$

$$\left. G_2 = \frac{\sigma_2}{d_2} S, \tau_1 = \frac{\varepsilon_1}{\sigma_1}, \tau_2 = \frac{\varepsilon_2}{\sigma_2}, \tau_i = \frac{C_1 + C_2}{G_1 + G_2}\right)$$

From the equations (2) and (3), four conditions (A) to (D) can be assumed in order to decrease the charge Q.
Condition (A): $\tau_1$ is extremely large.
Condition (B): $V_2$ is close to zero, that is, $G_2$ is much larger than $G_1$.
Condition (C): $C_2$ is close to zero.
Condition (D): $\tau_1$ is close to $\tau_2$.

In order to make $\tau_1$ extremely large under the condition (A), $(C_1+C_2)$ may be made extremely larger than $(G_1+G_2)$ from $\tau_1=(C_1+C_2)/(G_1+G_2)$. Since $C_1$ and $G_1$ are parameters of the oxide semiconductor film 403, $C_2$ needs to be increased in order to decrease the charge Q by the metal oxide film 407. However, when $C_2$ is increased by $\varepsilon_2$, Q becomes large according to the equation (2) because $C_2=\varepsilon_2 S/d_2$, so that there is a contradiction. In other words, the charge Q cannot be adjusted by $\tau_1$.

In order to make $V_2$ close to zero under the condition (B), $G_2 \gg G_1$ may be satisfied from the equation (3). Since $G_1$ is a parameter of the oxide semiconductor film 403, $G_2$ needs to be increased in order to decrease the charge Q by the metal oxide film 407. Specifically, $d_2$ is decreased or a material in which $\sigma_2$ is small is selected because $G_2=\sigma_2 S/d_2$. However, when $d_2$ is decreased, $C_2$ is increased from $C_2=\varepsilon_2 S/d_2$, so that Q is increased as in the case of the condition (A); thus, a decrease in $d_2$ cannot be employed. In addition, when $\sigma_2$ is large, the electric conductivity of the metal oxide film 407 is higher than that of the oxide semiconductor film 403, which leads to generation of a leakage current and a short circuit with a high probability; thus, a material in which $\sigma_2$ is large cannot be employed.

In order to make $C_2$ extremely small under the condition (C), from $C_2=\varepsilon_2 S/d_2$, $d_2$ is increased or a material in which $\varepsilon_2$ is small is selected.

In order to make $\tau_1$ close to $\tau_2$ under the condition (D), since $\tau_1=\varepsilon_1/\sigma_1$ and $\tau_2=\varepsilon_2/\sigma_2$, a film which satisfies $\varepsilon_1/\tau_1 \approx \varepsilon_2/\sigma_2$ may be selected. This is equivalent to $C_1/G_1 \approx C_2/G_2$.

Consequently, in order to prevent the accumulation of the charge Q efficiently, it is preferable that the thickness ($d_2$) of the metal oxide film 407 be increased or a material whose dielectric constant ($\varepsilon_2$) is small, preferably a material whose dielectric constant is smaller than that of the oxide semiconductor film 403 (for example, a material whose dielectric constant $\varepsilon$ is 8 to 20 inclusive) be selected as a material of the metal oxide film 407. Alternatively, a material whose physical property value is close to that of the oxide semiconductor film is preferably selected as a material of the metal oxide film so as to satisfy $\varepsilon_1/\sigma_1 \approx \varepsilon_2/\sigma_2$ ($\varepsilon_1$ is the dielectric constant of the oxide semiconductor and $\sigma_1$ is the electric conductivity of the oxide semiconductor).

As described above, in the transistor 410 including the metal oxide film 407 having a function of preventing electrification, charges can be prevented from being accumulated on the back channel side of the oxide semiconductor film. Further, even when the back channel side of the oxide semiconductor film is positively charged, a positive charge can be removed immediately with the metal oxide film provided over a top surface of the oxide semiconductor film. Furthermore, in the transistor 410 including the metal oxide film 407, generation of a parasitic channel on the back channel side of the oxide semiconductor film 403 can be prevented. By preventing the generation of a parasitic channel on the back channel side of the oxide semiconductor film in the transistor, variation in the threshold voltage can be suppressed. Consequently, variation in the electric conductivity and the like of the oxide semiconductor film can be suppressed, whereby the reliability of the transistor can be improved.

As described above, a semiconductor device including an oxide semiconductor with stable electric characteristics can be provided. Therefore, a semiconductor device with high reliability can be provided.

The structures, methods, and the like described in this embodiment can be combined as appropriate with any of the structures, methods, and the like described in other embodiments.

(Embodiment 2)

In this embodiment, another embodiment of a method for manufacturing a semiconductor device will be described. The same portion as or a portion having a function similar to that in the above embodiment can be formed as in the above embodiment, and the same step as or a step similar to that in the above embodiment can be performed as in the above embodiment, and thus, repetitive description is omitted. In addition, detailed description of the same portion is not repeated.

In this embodiment, an example of performing heat treatment on the oxide semiconductor film before forming the metal oxide film 407 in contact with the oxide semiconductor film, in the method for manufacturing the transistor 410 in Embodiment 1, will be described.

This heat treatment may be performed on the oxide semiconductor film before being processed into the island-shaped oxide semiconductor film, as long as the heat treatment is performed after the formation of the oxide semiconductor film and before the formation of the metal oxide film 407, and the heat treatment may be performed before the formation of the source electrode 405a and the drain electrode 405b or after the formation of the source electrode 405a and the drain electrode 405b.

The heat treatment is performed at a temperature of 250° C. to 650° C. inclusive, preferably 450° C. to 600° C. inclusive. For example, the substrate is introduced into an electric furnace which is one of heat treatment apparatuses, and the heat treatment is performed on the oxide semiconductor film at 450° C. for 1 hour in a nitrogen atmosphere. After the heat treatment, the metal oxide film is preferably formed without exposing the substrate to the air so that water or hydrogen can be prevented from entering the oxide semiconductor film.

Further, the heat treatment apparatus is not limited to an electric furnace, and a device for heating an object to be processed by heat conduction or heat radiation from a heating element such as a resistance heating element may be used. For example, an RTA apparatus such as a GRTA apparatus or an LRTA apparatus can be used. Note that in the case where a GRTA apparatus is used as the heat treatment apparatus, the substrate may be heated in an inert gas heated to a high temperature of 650° C. to 700° C. because the heat treatment time is short.

The heat treatment may be performed in an atmosphere of nitrogen, oxygen, ultra-dry air (air in which the water content is 20 ppm or less, preferably 1 ppm or less, more preferably 10 ppb or less), or a rare gas (argon, helium, or the like). Note that it is preferable that water, hydrogen, or the like be not contained in the atmosphere of nitrogen, oxygen, ultra-dry air, or a rare gas. Alternatively, nitrogen, oxygen, or a rare gas which is introduced into the heat treatment apparatus has a purity of 6N (99.9999%) or more, preferably 7N (99.99999%) or more (that is, the impurity concentration is 1 ppm or less, preferably 0.1 ppm or less).

With this heat treatment, impurities such as moisture or hydrogen in the oxide semiconductor film can be reduced.

Further, when the oxide semiconductor film and the metal oxide film containing oxygen are subjected to heat treatment while being in contact with each other, oxygen which is one of the main components of the oxide semiconductor and is reduced in the step of removing impurities, can be supplied from the metal oxide film containing oxygen to the oxide semiconductor film.

Thus, when the oxide semiconductor film is subjected to the heat treatment before forming the metal oxide film and the heat treatment after forming the metal oxide film, an i-type (intrinsic) oxide semiconductor film or a substantially i-type oxide semiconductor film from which impurities such as moisture or hydrogen are further eliminated, can be obtained.

Therefore, the transistor including the highly purified oxide semiconductor film has suppressed variation in the electric characteristics and is electrically stable.

Furthermore, in the transistor including the metal oxide film, generation of a parasitic channel on the back channel side of the oxide semiconductor film can be prevented.

As described above, a semiconductor device including an oxide semiconductor, which has stable electric characteristics, can be provided. Therefore, a semiconductor device with high reliability can be provided.

The structures, methods, and the like described in this embodiment can be combined as appropriate with any of the structures, methods, and the like described in other embodiments.

(Embodiment 3)

A semiconductor device with a display function (also referred to as a display device) can be manufactured using the transistor whose example is described in Embodiment 1 or 2. Moreover, some or all of driver circuits which include transistors can be formed over a substrate where a pixel portion is formed, whereby a system-on-panel can be obtained.

Figure 2A:
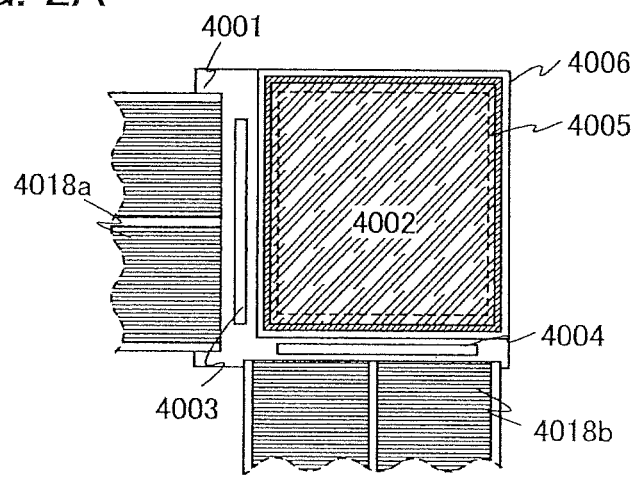
FIGS. 2A to 2C are diagrams each illustrating an embodiment of a semiconductor device.

In FIG. 2A, a sealant 4005 is provided so as to surround a pixel portion 4002 provided over a first substrate 4001, and the pixel portion 4002 is sealed by using a second substrate 4006. In FIG. 2A, a signal line driver circuit 4003 and a scan line driver circuit 4004 which are formed using a single crystal semiconductor film or a polycrystalline semiconductor film over a substrate separately prepared are mounted in a region that is different from the region surrounded by the sealant 4005 over the first substrate 4001. Various signals and potentials are supplied to the signal line driver circuit 4003 and the scan line driver circuit 4004 which are separately formed and the pixel portion 4002 from flexible printed circuits (FPCs) 4018a and 4018b.

Figure 2B:
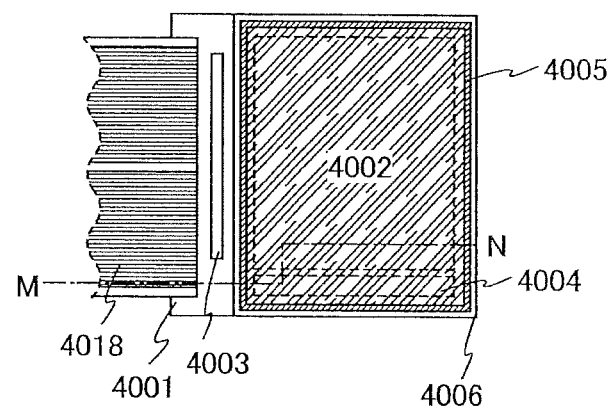
Figure 2C:
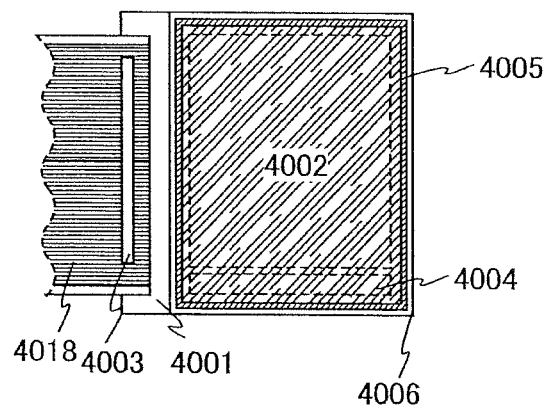

In FIGS. 2B and 2C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a display element, by the first substrate 4001, the sealant 4005, and the second substrate 4006. In FIGS. 2B and 2C, the signal line driver circuit 4003 which is formed using a single crystal semiconductor film or a polycrystalline semiconductor film over a substrate separately prepared is mounted in a region that is different from the region surrounded by the sealant 4005 over the first substrate 4001. In FIGS. 2B and 2C, various signals and potential are supplied to the signal line driver circuit 4003 which is separately formed, the scan line driver circuit 4004, and the pixel portion 4002 from an FPC 4018.

Although FIGS. 2B and 2C each illustrate the example in which the signal line driver circuit 4003 is formed separately and mounted on the first substrate 4001, the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method, or the like can be used. FIG. 2A illustrates the example in which the signal line driver circuit 4003 and the scan line driver circuit 4004 are mounted by a COG method. FIG. 2B illustrates the example in which the signal line driver circuit 4003 is mounted by a COG method. FIG. 2C illustrates the example in which the signal line driver circuit 4003 is mounted by a TAB method.

In addition, the display device includes a panel in which the display element is sealed, and a module in which an IC and the like including a controller are mounted on the panel.

Note that the display device in this specification means an image display device, a display device, or a light source (including a lighting device). Furthermore, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

Further, the pixel portion and the scan line driver circuit which are provided over the first substrate 4001 include a plurality of transistors, to which the transistor whose example is described in Embodiment 1 or 2 can be applied.

As a display element provided in the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

Figure 3:
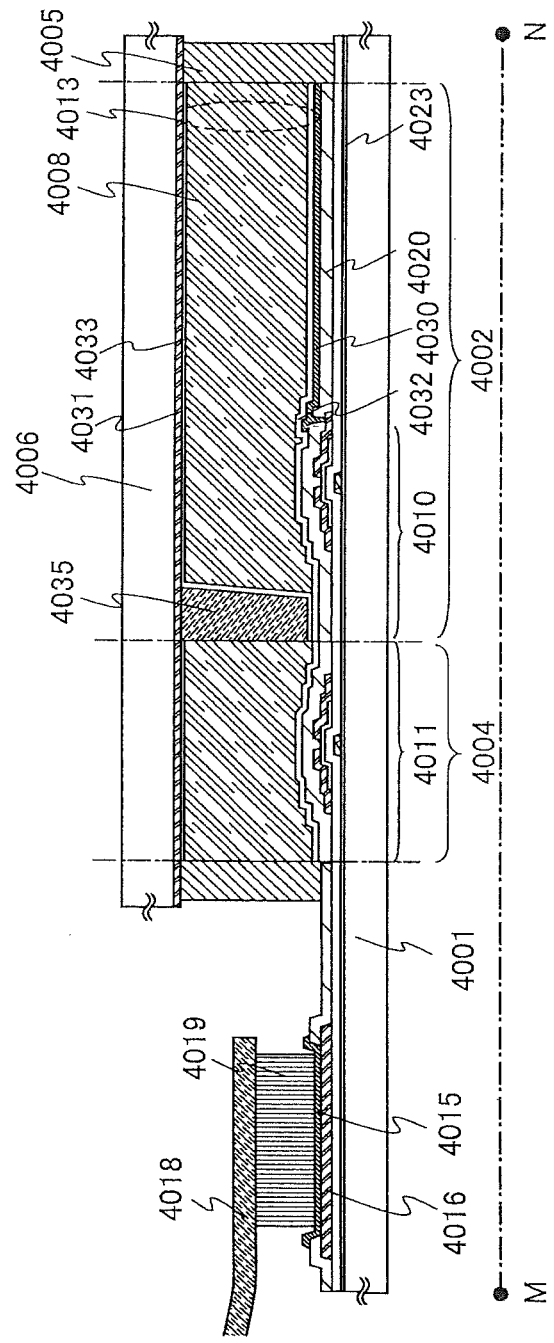
FIG. 3 is a diagram illustrating an embodiment of a semiconductor device.
Figure 4:
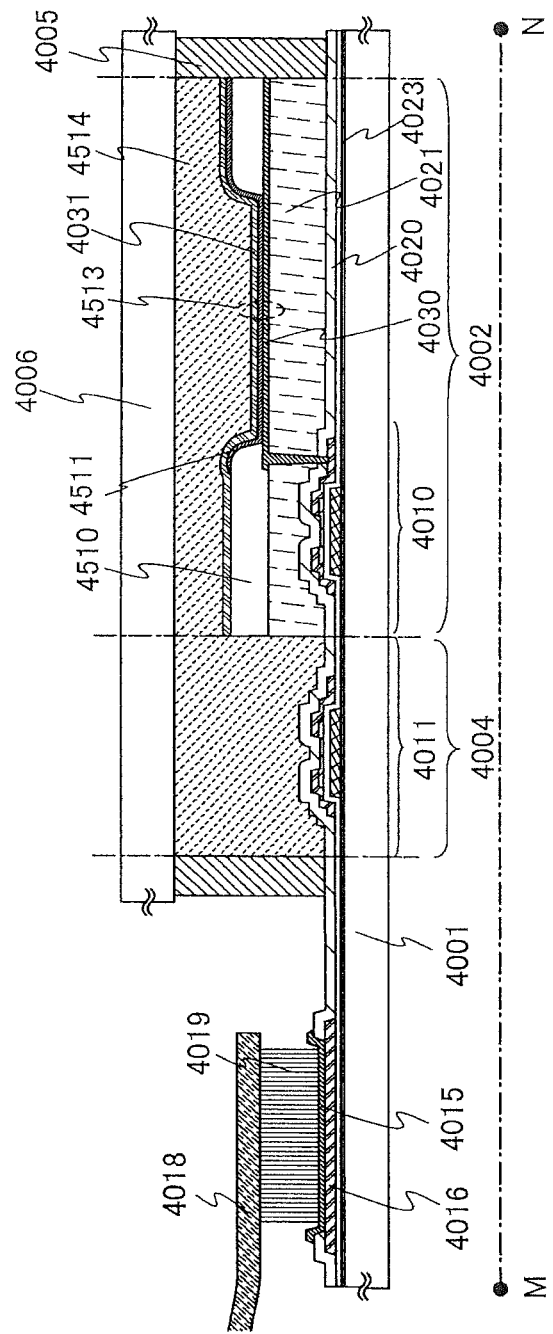
FIG. 4 is a diagram illustrating an embodiment of a semiconductor device.
Figure 5:
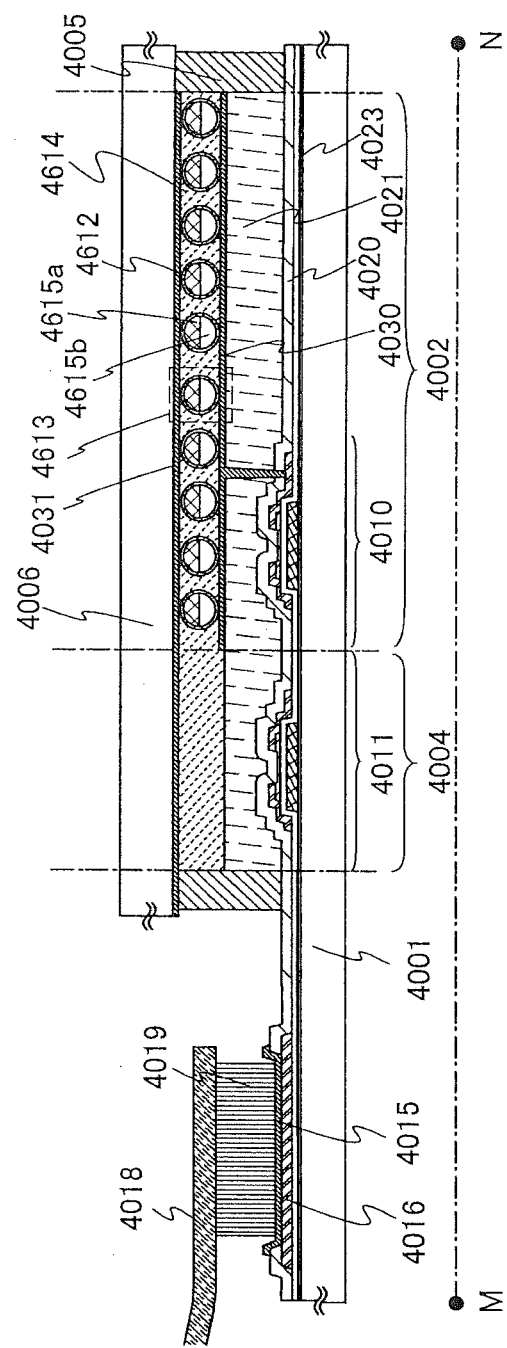
FIG. 5 is a diagram illustrating an embodiment of a semiconductor device.

Embodiments of the semiconductor device will be described with reference to FIG. 3, FIG. 4, and FIG. 5. FIG. 3, FIG. 4, and FIG. 5 correspond to cross-sectional views along line M-N in FIG. 2B.

As illustrated in FIG. 3, FIG. 4, and FIG. 5, the semiconductor device includes a connection terminal electrode 4015 and a terminal electrode 4016, and the connection terminal electrode 4015 and the terminal electrode 4016 are electrically connected to a terminal included in the FPC 4018 through an anisotropic conductive film 4019.

The connection terminal electrode 4015 is formed using the same conductive film as a first electrode layer 4030, and the terminal electrode 4016 is formed using the same conductive film as source and drain electrodes of transistors 4010 and 4011.

Each of the pixel portion 4002 and the scan line driver circuit 4004 which are provided over the first substrate 4001 includes a plurality of transistors. In FIG. 3, FIG. 4, and FIG. 5, the transistor 4010 included in the pixel portion 4002 and the transistor 4011 included in the scan line driver circuit 4004 are illustrated as an example. In FIG. 3, a metal oxide film 4020 having a function of preventing electrification is provided over the transistors 4010 and 4011. In FIG. 4 and FIG. 5, an insulating layer 4021 is further provided. Note that an insulating film 4023 is an insulating film serving as a base film.

In this embodiment, the transistor described in Embodiment 1 or 2 can be applied to the transistors 4010 and 4011.

In the transistors 4010 and 4011, the oxide semiconductor film is an oxide semiconductor film which is highly purified and from which impurities such as hydrogen, moisture, a hydroxyl group, or hydride (also referred to as a hydrogen compound) are intentionally removed. Such an oxide semiconductor film is obtained by performing heat treatment after forming the metal oxide film 4020 stacked over the oxide semiconductor film.

The oxide semiconductor film and the metal oxide film 4020 containing oxygen are in contact with each other when being subjected to the heat treatment; thus, oxygen which is one of the main components of the oxide semiconductor and is reduced in the step of removing impurities, can be supplied from the metal oxide film 4020 containing oxygen to the oxide semiconductor film. Thus, the oxide semiconductor film is more highly purified to become electrically i-type (intrinsic).

Consequently, variation in the electric characteristics of the transistors 4010 and 4011 each including the highly purified oxide semiconductor film is suppressed and the transistors 4010 and 4011 are electrically stable. As described above, semiconductor devices with high reliability can be provided as the semiconductor devices of this embodiment illustrated in FIG. 3, FIG. 4, and FIG. 5.

In addition, in the transistor including the metal oxide film having a function of preventing electrification, generation of a parasitic channel on the back channel side of the oxide semiconductor film can be prevented. By preventing the generation of a parasitic channel on the back channel side of the oxide semiconductor film in the transistor, variation in the threshold voltage can be suppressed.

In addition, in this embodiment, a conductive layer may be provided over the metal oxide film so as to overlap with a channel formation region of the oxide semiconductor film in the transistor 4011 for the driver circuit. By providing the conductive layer so as to overlap with the channel formation region of the oxide semiconductor film, the amount of change in the threshold voltage of the transistor 4011 before and after the BT test can be further reduced. The potential of the conductive layer may be the same as or different from that of a gate electrode of the transistor 4011. The conductive layer can also function as a second gate electrode. The potential of the conductive layer may be GND, 0V, or in a floating state.

In addition, the conductive layer functions to block an external electric field, that is, to prevent an external electric field (particularly, to block static electricity) from effecting the inside (a circuit portion including a thin film transistor). A blocking function of the conductive layer can prevent the variation in the electric characteristics of the transistor due to the effect of an external electric field such as static electricity.

The transistor 4010 included in the pixel portion 4002 is electrically connected to a display element to form a display panel. A variety of display elements can be used as the display element as long as display can be performed.

Note that an example of a liquid crystal display device using a liquid crystal element as a display element is illustrated in FIG. 3. In FIG. 3, a liquid crystal element 4013 which is a display element includes the first electrode layer 4030, a second electrode layer 4031, and a liquid crystal layer 4008. An insulating film 4032 and an insulating film 4033 which serve as alignment films are provided so that the liquid crystal layer 4008 is interposed therebetween. The second electrode layer 4031 is provided on the second substrate 4006 side, and the first electrode layer 4030 and the second electrode layer 4031 are stacked, with the liquid crystal layer 4008 interposed therebetween.

A columnar spacer denoted by reference numeral 4035 is obtained by selective etching of an insulating film and is provided in order to control the thickness of the liquid crystal layer 4008 (a cell gap). Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, liquid crystal exhibiting a blue phase for which an alignment film is unnecessary may be used. A blue phase is one of liquid crystal phases, which is generated just before a cholesteric phase changes into an isotropic phase while the temperature of cholesteric liquid crystal is increased. Since the blue phase appears only in a narrow temperature range, a liquid crystal composition in which 5 wt % or more of a chiral material is mixed is used for the liquid crystal layer in order to improve the temperature range. The liquid crystal composition which includes liquid crystal exhibiting a blue phase and a chiral material has a short response time of 1 msec or less, has optical isotropy, which makes the alignment process unneeded, and has a small viewing angle dependence. In addition, since an alignment film does not need to be provided and thus rubbing treatment is unnecessary, electrostatic discharge damage caused by rubbing treatment can be prevented, and defects and damage of the liquid crystal display device can be reduced in the manufacturing process. Thus, the productivity of the liquid crystal display device can be increased. A transistor including an oxide semiconductor film has a possibility that the electric characteristics may vary significantly by the influence of static electricity and deviate from the designed range. Therefore, it is more effective to use a liquid crystal material exhibiting a blue phase for a liquid crystal display device including a transistor that includes an oxide semiconductor film.

The specific resistivity of the liquid crystal material is $1 \times 10^9$ Ω·cm or more, preferably $1 \times 10^{11}$ Ω·cm or more, more preferably $1 \times 10^{12}$ Ω·cm or more. The value of the specific resistivity in this specification is measured at 20° C.

The size of a storage capacitor formed in the liquid crystal display device is set considering the leakage current of the transistor provided in the pixel portion or the like so that charges can be held for a predetermined period. By using the transistor including the high-purity oxide semiconductor film, it is enough to provide a storage capacitor having a capacitance that is ⅓ or less, preferably ⅕ or less of a liquid crystal capacitance of each pixel.

In the transistor used in this embodiment, which includes the highly purified oxide semiconductor film, the current in an off state (the off-state current) can be made small. Accordingly, an electric signal such as an image signal can be held for a longer period, and a writing interval can be set long in an on state. Accordingly, frequency of refresh operation can be reduced, which leads to an effect of suppressing power consumption.

In addition, the transistor including the highly purified oxide semiconductor film used in this embodiment can have relatively high field-effect mobility and thus can operate at high speed. Therefore, by using the transistor in the pixel portion of the liquid crystal display device, a high-quality image can be provided. In addition, since the driver circuit portion and the pixel portion which include the transistor can be formed over one substrate, the number of components of the liquid crystal display device can be reduced.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode may be used. The vertical alignment mode is a method of controlling alignment of liquid crystal molecules of a liquid crystal display panel, in which liquid crystal molecules are aligned vertically to a panel surface when no voltage is applied. Some examples are given as the vertical alignment mode. For example, a multi-domain vertical alignment (MVA) mode, a patterned vertical alignment (PVA) mode, an ASV mode, and the like can be given. Moreover, it is possible to use a method called domain multiplication or multi-domain design, in which a pixel is divided into some regions (subpixels) and molecules are aligned in different directions in different regions.

In addition, in the display device, a black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

In addition, it is possible to employ a time-division display method (also called a field-sequential driving method) with the use of a plurality of light-emitting diodes (LEDs) as a backlight. By employing a field-sequential driving method, color display can be performed without using a color filter.

As a display method for the pixel portion, a progressive method, an interlace method, or the like can be employed. Further, color elements controlled in a pixel at the time of color display are not limited to three colors: R, G, and B (R, G, and B correspond to red, green, and blue, respectively). For example, R, G, B, and W (W corresponds to white); or R, G, B, and one or more of yellow, cyan, magenta, and the like can be used. Further, the sizes of display regions may be different between dots of respective color elements. This embodiment is not limited to the application to a display device for color display but can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer in which particles of a light-emitting material are dispersed in a binder, and its light emission mechanism is donor-acceptor recombination type light emission that utilizes a donor level and an acceptor level. A thin-film inorganic EL element has a structure in which a light-emitting layer is sandwiched between dielectric layers, which are further sandwiched between electrodes, and its light emission mechanism is localized type light emission that utilizes inner-shell electron transition of metal ions. Note that the case where an organic EL element is used as a light-emitting element is described here.

In order to extract light emitted from the light-emitting element, it is acceptable as long as at least one of a pair of electrodes is transparent. A transistor and a light-emitting element are formed over a substrate. The light-emitting element can have a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side. A light-emitting element having any of these emission structures can be used.

FIG. 4 illustrates an example of a light-emitting device in which a light-emitting element is used as a display element. A light-emitting element 4513 which is a display element is electrically connected to the transistor 4010 provided in the pixel portion 4002. A structure of the light-emitting element 4513 is not limited to the stacked-layer structure including the first electrode layer 4030, an electroluminescent layer 4511, and the second electrode layer 4031, which is illustrated in FIG. 4. The structure of the light-emitting element 4513 can be changed as appropriate depending on a direction in which light is extracted from the light-emitting element 4513, or the like.

A partition wall 4510 is formed using an organic insulating material or an inorganic insulating material. It is particularly preferable that the partition wall 4510 be formed using a photosensitive resin material to have an opening over the first electrode layer 4030 so that a sidewall of the opening is formed as a tilted surface with continuous curvature.

The electroluminescent layer 4511 may be formed using a single layer or a plurality of layers stacked.

A protective film may be formed over the second electrode layer 4031 and the partition wall 4510 in order to prevent entry of oxygen, hydrogen, moisture, carbon dioxide, or the like into the light-emitting element 4513. As the protective film, a silicon nitride film, a silicon nitride oxide film, a DLC film, or the like can be formed. In addition, in a space which is formed with the first substrate 4001, the second substrate 4006, and the sealant 4005, a filler 4514 is provided for sealing. It is preferable that the light-emitting device be packaged (sealed) with a protective film (such as a laminate film or an ultraviolet curable resin film) or a cover material with high air-tightness and little degasification so as not to be exposed to the outside air, in this manner.

As the filler 4514, an ultraviolet curable resin or a thermosetting resin can be used, in addition to an inert gas such as nitrogen or argon, and polyvinyl chloride (PVC), acrylic, polyimide, an epoxy resin, a silicone resin, polyvinyl butyral (PVB), or ethylene vinyl acetate (EVA) can be used. For example, nitrogen is used for the filler.

In addition, if needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Further, an electronic paper in which electronic ink is driven can be provided as the display device. The electronic paper is also called an electrophoretic display device (electrophoretic display) and has advantages in that it has the same level of readability as regular paper, it has less power consumption than other display devices, and it can be set to have a thin and light form.

An electrophoretic display device can have various modes. An electrophoretic display device includes a plurality of microcapsules dispersed in a solvent or a solute, each microcapsule including first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display device is a display that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material thereof.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

FIG. 5 illustrates an active matrix electronic paper as an embodiment of the semiconductor device. The electronic paper in FIG. 5 is an example of a display device using a twisting ball display system.

Between the first electrode layer 4030 connected to the transistor 4010 and the second electrode layer 4031 provided on the second substrate 4006, spherical particles 4613 each of which includes a black region 4615a, a white region 4615b, and a cavity 4612 which is filled with liquid around the black region 4615a and the white region 4615b, are provided. A space around the spherical particles 4613 is filled with a filler 4614 such as a resin. The second electrode layer 4031 corresponds to a common electrode (counter electrode). The second electrode layer 4031 is electrically connected to a common potential line.

In FIG. 3, FIG. 4, and FIG. 5, as the first substrate 4001 and the second substrate 4006, flexible substrates, for example, plastic substrates having a light-transmitting property or the like can be used, in addition to glass substrates. As plastic, a fiberglass-reinforced plastic (FRP) plate, a polyvinyl fluoride (PVF) film, a polyester film, or an acrylic resin film can be used. In addition, a sheet with a structure in which an aluminum foil is sandwiched between PVF films or polyester films can be used.

In addition, the metal oxide film 4020 has a function of supplying the oxide semiconductor film with oxygen which is reduced in the step of removing impurities such as hydrogen, moisture, a hydroxyl group, or hydride as well as a function of preventing generation of a parasitic channel on the back channel side of the oxide semiconductor film.

The metal oxide film 4020 may be formed using a gallium oxide film formed by a sputtering method. Alternatively, the metal oxide film 4020 may be a film obtained by adding indium or zinc to gallium oxide, for example; a gallium oxide film containing indium or zinc at 0.01 at. % to 5 at. % can be used. By addition of indium or zinc, the electric conductivity of the metal oxide film 4020 can be improved, whereby accumulation of charges can be further reduced.

The insulating layer 4021 can be formed using an inorganic insulating material or an organic insulating material. Note that the insulating layer 4021 formed using a heat-resistant organic insulating material such as an acrylic resin, polyimide, a benzocyclobutene resin, polyamide, or an epoxy resin is preferably used as a planarizing insulating film. Other than such organic insulating materials, it is possible to use a low-dielectric constant material (a low-k material), a siloxane based resin, phosphosilicate glass (PSG), borophosphosilicate glass (BPSG), or the like. The insulating layer may be formed by stacking a plurality of insulating films formed of these materials.

There is no particular limitation on the method for forming the insulating layer 4021, and the insulating layer 4021 can be formed, depending on the material, by a sputtering method, a spin coating method, a dipping method, spray coating, a droplet discharge method (e.g., an inkjet method), screen printing, or offset printing), roll coating, curtain coating, knife coating, or the like.

The display device displays an image by transmitting light from a light source or a display element. Therefore, the substrate and the thin films such as the insulating film and the conductive film provided for the pixel portion where light is transmitted have light-transmitting properties with respect to light in the visible-light wavelength range.

The first electrode layer 4030 and the second electrode layer 4031 (each of which is also called a pixel electrode layer, a common electrode layer, a counter electrode layer, or the like) for applying voltage to the display element may have light-transmitting properties or light-reflecting properties, which depends on the direction in which light is extracted, the position where the electrode layer is provided, the pattern structure of the electrode layer, and the like.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

The first electrode layer 4030 and the second electrode layer 4031 can be formed of one or more kinds of materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys of these metals; and nitrides of these metals.

A conductive composition containing a conductive high molecule (also referred to as a conductive polymer) can be used for the first electrode layer 4030 and the second electrode layer 4031. As the conductive high molecule, a so-called π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof, and the like can be given.

Since the transistor is easily broken owing to static electricity or the like, a protective circuit for protecting the driver circuit is preferably provided. The protective circuit is preferably formed using a nonlinear element.

By using any of the transistors described in Embodiment 1 or 2 as described above, the semiconductor device can have a variety of functions.

(Embodiment 4)

A semiconductor device having an image sensor function for reading data of an object can be formed with the use of the transistor whose example is described in Embodiment 1 or 2.

Figure 6A:
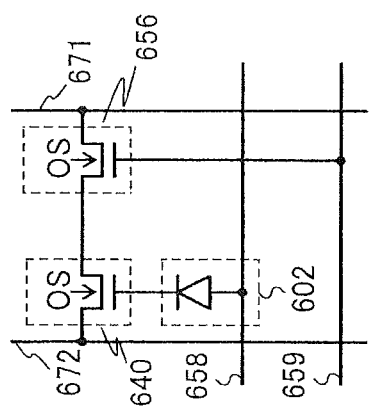
FIGS. 6A and 6B are diagrams illustrating an embodiment of a semiconductor device.

An example of the semiconductor device having an image sensor function is illustrated in FIG. 6A. FIG. 6A is an equivalent circuit of a photo sensor and FIG. 6B is a cross-sectional view illustrating part of the photo sensor.

One electrode of a photodiode 602 is electrically connected to a photodiode reset signal line 658, and the other electrode of the photodiode 602 is electrically connected to a gate of a transistor 640. One of a source and a drain of the transistor 640 is electrically connected to a photo sensor reference signal line 672, and the other of the source and the drain of the transistor 640 is electrically connected to one of a source and a drain of a transistor 656. A gate of the transistor 656 is electrically connected to a gate signal line 659, and the other of the source and the drain of the transistor 656 is electrically connected to a photo sensor output signal line 671.

Note that in circuit diagrams in this specification, a transistor including an oxide semiconductor film is denoted by a symbol "OS" so that it can be identified as a transistor including an oxide semiconductor film. The transistor 640 and the transistor 656 in FIG. 6A are transistors each including an oxide semiconductor film.

Figure 6B:
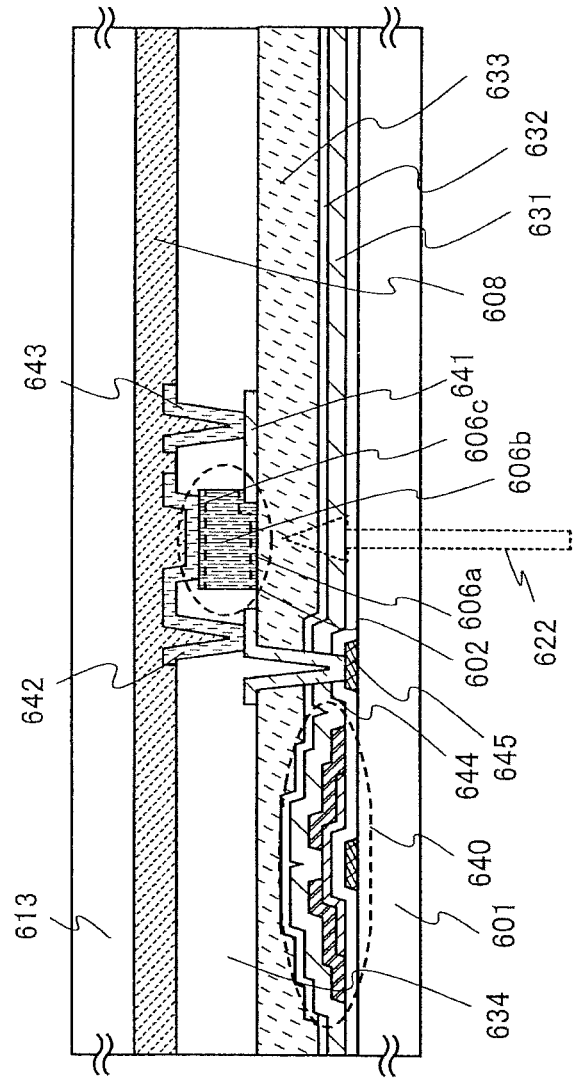

FIG. 6B is a cross-sectional view of the photodiode 602 and the transistor 640 in the photo sensor. The photodiode 602 functioning as a sensor and the transistor 640 are provided over a substrate 601 (a TFT substrate) having an insulating surface. A substrate 613 is provided over the photodiode 602 and the transistor 640 using an adhesive layer 608.

A metal oxide film 631 having a function of preventing electrification, an interlayer insulating layer 633, and an interlayer insulating layer 634 are provided over the transistor 640. The photodiode 602 is provided over the interlayer insulating layer 633. In the photodiode 602, a first semiconductor layer 606a, a second semiconductor layer 606b, and a third semiconductor layer 606c are stacked in that order over the interlayer insulating layer 633 between an electrode layer 641 formed over the interlayer insulating layer 633 and an electrode layer 642 formed over the interlayer insulating layer 634.

In the transistor 640, the oxide semiconductor film is an oxide semiconductor film which is highly purified and from which impurities such as hydrogen, moisture, a hydroxyl group, or hydride (also referred to as a hydrogen compound) are intentionally removed by performing heat treatment.

The oxide semiconductor film and the metal oxide film 631 containing oxygen are in contact with each other when being subjected to the heat treatment; thus, oxygen which is one of the main components of the oxide semiconductor and is reduced in the step of removing impurities, can be supplied from the metal oxide film 631 containing oxygen to the oxide semiconductor film. Thus, the oxide semiconductor film is more highly purified to become electrically i-type (intrinsic).

Consequently, variation in the electric characteristics of the transistor 640 including the highly purified oxide semiconductor film is suppressed and the transistor 640 is electrically stable. As described above, a semiconductor device with high reliability can be provided as the semiconductor device in this embodiment.

The electrode layer 641 is electrically connected to a conductive layer 643 which is formed in the interlayer insulating layer 634, and the electrode layer 642 is electrically connected to a gate electrode 645 through an electrode layer 644. The gate electrode 645 is electrically connected to a gate electrode of the transistor 640, and the photodiode 602 is electrically connected to the transistor 640.

Here, a pin photodiode in which a semiconductor layer having p-type conductivity as the first semiconductor layer 606a, a high-resistance semiconductor layer (i-type semiconductor layer) as the second semiconductor layer 606b, and a semiconductor layer having n-type conductivity as the third semiconductor layer 606c are stacked is illustrated as an example.

The first semiconductor layer 606a is a p-type semiconductor layer and can be formed using an amorphous silicon film containing an impurity element imparting p-type conductivity. The first semiconductor layer 606a is formed by a plasma CVD method with the use of a semiconductor source gas containing an impurity element belonging to Group 13 (such as boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with the use of a diffusion method or an ion implantation method. Heating or the like may be conducted after introducing the impurity element by an ion implantation method or the like in order to diffuse the impurity element. In this case, as a method for forming the amorphous silicon film, an LPCVD method, a vapor deposition method, a sputtering method, or the like may be used. The first semiconductor layer 606a is preferably formed to have a thickness of 10 nm to 50 nm inclusive.

The second semiconductor layer 606b is an i-type semiconductor layer (intrinsic semiconductor layer) and is formed using an amorphous silicon film. As for formation of the second semiconductor layer 606b, an amorphous silicon film is formed with the use of a semiconductor source gas by a plasma CVD method. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor layer 606b may be formed by an LPCVD method, a vapor deposition method, a sputtering method, or the like. The second semiconductor layer 606b is preferably formed to have a thickness of 200 nm to 1000 nm inclusive.

The third semiconductor layer 606c is an n-type semiconductor layer and is formed using an amorphous silicon film containing an impurity element imparting n-type conductivity. The third semiconductor layer 606c is formed by a plasma CVD method with the use of a semiconductor source gas containing an impurity element belonging to Group 15 (e.g., phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with the use of a diffusion method or an ion implantation method. Heating or the like may be conducted after introducing the impurity element by an ion implantation method or the like in order to diffuse the impurity element. In this case, as a method for forming the amorphous silicon film, an LPCVD method, a vapor deposition method, a sputtering method, or the like may be used. The third semiconductor layer 606c is preferably formed to have a thickness of 20 nm to 200 nm inclusive.

The first semiconductor layer 606a, the second semiconductor layer 606b, and the third semiconductor layer 606c are not necessarily formed using an amorphous semiconductor, and they may be formed using a polycrystalline semiconductor or a microcrystalline semiconductor (a semi-amorphous semiconductor: SAS).

Considering Gibbs free energy, a microcrystalline semiconductor is in a metastable state which is intermediate between an amorphous state and a single crystal state. That is, the microcrystalline semiconductor is a semiconductor having a third state which is stable in terms of free energy and has a short range order and lattice distortion. Columnar-like or needle-like crystals grow in a normal direction with respect to a substrate surface. The Raman spectrum of microcrystalline silicon, which is a typical example of a microcrystalline semiconductor, is located in lower wave numbers than 520 $cm^{-1}$, which represents a peak of the Raman spectrum of single crystal silicon. That is, the peak of the Raman spectrum of the microcrystalline silicon exists between 520 $cm^{-1}$ which represents single crystal silicon and 480 $cm^{-1}$ which represents amorphous silicon. The semiconductor contains hydrogen or halogen of at least 1 at. % to terminate a dangling bond. Moreover, microcrystalline silicon contains a rare gas element such as helium, argon, krypton, or neon to further promote lattice distortion, so that stability can be increased and a favorable microcrystalline semiconductor film can be obtained.

The microcrystalline semiconductor film can be formed by a high-frequency plasma CVD method with a frequency of several tens of megahertz to several hundreds of megahertz or using a microwave plasma CVD apparatus with a frequency of 1 GHz or more. Typically, the microcrystalline semiconductor film can be formed using a gas containing silicon such as $SiH_4$, $Si_2H_6$, $SiH_2Cl_2$, $SiHCl_3$, $SiCl_4$, or $SiF_4$, which is diluted with hydrogen. Further, with the gas containing silicon diluted with one or plural kinds of rare gas elements selected from helium, argon, krypton, and neon in addition to hydrogen, the microcrystalline semiconductor film can be formed. In that case, the flow ratio of hydrogen to the gas containing silicon is 5:1 to 200:1 inclusive, preferably 50:1 to 150:1 inclusive, more preferably 100:1. Further, a hydrocarbon gas such as $CH_4$ or $C_2H_6$, a gas containing germanium such as $GeH_4$ or $GeF_4$, $F_2$, or the like may be mixed into the gas containing silicon.

In addition, since the mobility of holes generated by the photoelectric effect is lower than that of electrons, the pin photodiode has better characteristics when a surface on the p-type semiconductor layer side is used as a light-receiving surface. Here, an example in which light 622 received by the photodiode 602 from a surface of the substrate 601, over which the pin photodiode is formed, is converted into electric signals is described. Further, light from the semiconductor layer having a conductivity type opposite to that of the semiconductor layer on the light-receiving surface is disturbance light; therefore, the electrode layer on that side is preferably formed using a light-blocking conductive film. Note that a surface of the n-type semiconductor layer side can alternatively be used as the light-receiving surface.

The metal oxide film 631 may be formed using a gallium oxide film formed by a sputtering method. In addition, the metal oxide film 631 may be a film obtained by adding indium or zinc to gallium oxide; for example, a gallium oxide film containing indium or zinc at 0.01 at. % to 5 at. % can be used. By addition of indium or zinc, the electric conductivity of the metal oxide film 631 can be improved, whereby accumulation of charges can be further reduced.

For reduction of the surface roughness, an insulating layer functioning as a planarizing insulating film is preferably used as the interlayer insulating layers 633 and 634. The interlayer insulating layers 633 and 634 can be formed using, for example, an organic insulating material such as polyimide, an acrylic resin, a benzocyclobutene resin, polyamide, or an epoxy resin. Other than such organic insulating materials, a single-layer or stacked-layer structure using a low-dielectric constant material (a low-k material), a siloxane based resin, phosphosilicate glass (PSG), borophosphosilicate glass (BPSG), or the like can be used.

The interlayer insulating layer 633 and the interlayer insulating layer 634 can be formed using an insulating material by a sputtering method, a spin coating method, a dipping method, spray coating, a droplet discharge method (e.g., an inkjet method, screen printing, or offset printing), roll coating, curtain coating, knife coating, or the like depending on the material.

When the light 622 that enters the photodiode 602 is detected, data on an object to be detected can be read. Note that a light source such as a backlight can be used at the time of reading data on an object to be detected.

The transistor whose example is described in Embodiment 1 or 2 can be used as the transistor 640. The transistor including the oxide semiconductor film which is highly purified by intentionally removing impurities such as hydrogen, moisture, a hydroxyl group, or hydride (also referred to as a hydrogen compound) has a suppressed variation in the electric characteristics and is electrically stable. In addition, in the transistor including the metal oxide film having a function of preventing electrification, generation of a parasitic channel on the back channel side of the oxide semiconductor film can be prevented. By preventing the generation of a parasitic channel on the back channel side of the oxide semiconductor film in the transistor, variation in the threshold voltage can be suppressed. Therefore, a semiconductor device with high reliability can be provided.

This embodiment can be implemented in appropriate combination with the structures described in other embodiments.

(Embodiment 5)

The liquid crystal display device disclosed in this specification can be applied to a variety of electronic devices (including game machines). Examples of the electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a personal digital assistant, an audio reproducing device, a large-sized game machine such as a pachinko machine, and the like. Examples of the electronic devices each including the liquid crystal display device described in the above embodiment will be described.

Figure 7A:
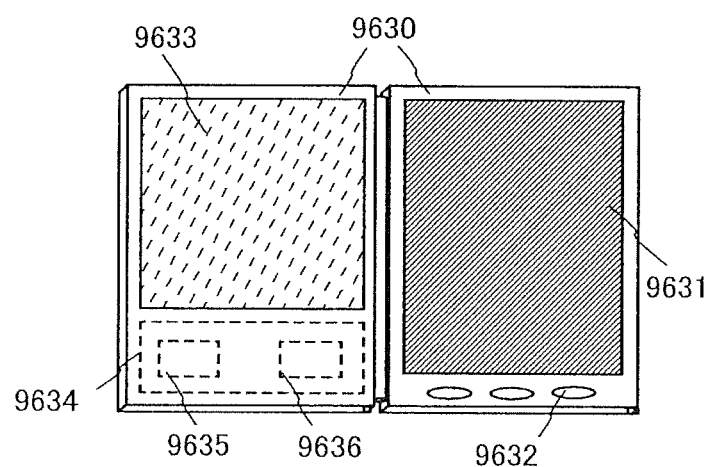
FIGS. 7A and 7B are diagrams illustrating an electronic device.

FIG. 7A illustrates an electronic book reader (also referred to as an e-book reader) which can include housings 9630, a display portion 9631, operation keys 9632, a solar cell 9633, and a charge and discharge control circuit 9634. The electronic book reader illustrated in FIG. 7A has a function of displaying various kinds of data (e.g., a still image, a moving image, and a text image) on the display portion, a function of displaying a calendar, a date, the time, or the like on the display portion, a function of operating or editing the data displayed on the display portion, a function of controlling processing by various kinds of software (programs), and the like. Note that in FIG. 7A, the charge and discharge control circuit 9634 has a battery 9635 and a DCDC converter (hereinafter, abbreviated as a converter) 9636 as an example. The semiconductor device described in any of Embodiments 1 to 4 can be applied to the display portion 9631, whereby a highly reliable electronic book reader can be provided.

In the case of using a transflective or reflective liquid crystal display device as the display portion 9631 in the structure illustrated in FIG. 7A, the electronic book reader may be used in a comparatively bright environment. In that case, power generation by the solar cell 9633 and charge by the battery 9635 can be effectively performed, which is preferable. Since the solar cell 9633 can be provided on a space (a surface or a rear surface) of the housing 9630 as appropriate, the battery 9635 can be efficiently charged, which is preferable. When a lithium ion battery is used as the battery 9635, there is an advantage of downsizing or the like.

Figure 7B:
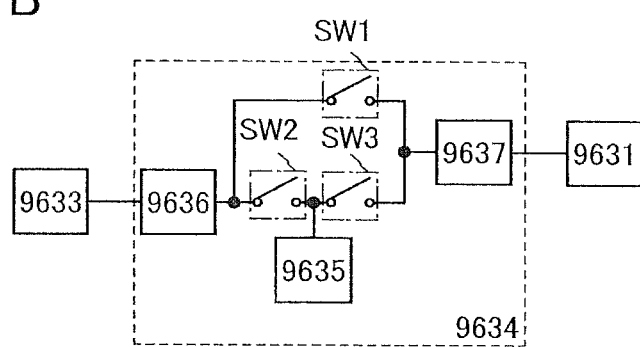

The structure and the operation of the charge and discharge control circuit 9634 illustrated in FIG. 7A are described with reference to a block diagram in FIG. 7B. The solar cell 9633, the battery 9635, the converter 9636, a converter 9637, switches SW1 to SW3, and the display portion 9631 are illustrated in FIG. 7B, and the battery 9635, the converter 9636, the converter 9637, and the switches SW1 to SW3 correspond to the charge and discharge control circuit 9634.

First, an example of the operation in the case where power is generated by the solar cell 9633 using external light is described. The voltage of power generated by the solar cell 9633 is raised or lowered by the converter 9636 so as to be voltage for charging the battery 9635. Then, when the power from the solar cell 9633 is used for the operation of the display portion 9631, the switch SW1 is turned on and the voltage of the power is raised or lowered by the converter 9637 so as to be a voltage needed for the display portion 9631. In addition, when display on the display portion 9631 is not performed, the switch SW1 is turned off and the switch SW2 is turned on so that charge of the battery 9635 may be performed.

Next, the operation in the case where power is not generated by the solar cell 9633 using external light is described. The voltage of power stored in the battery 9635 is raised or lowered by the converter 9637 by turning on the switch SW3. Then, power from the battery 9635 is used for the operation of the display portion 9631.

Note that although the solar cell 9633 is described as an example of a means for charge, charge of the battery 9635 may be performed with another means. In addition, a combination of the solar cell 9633 and another means for charge may be used.

Figure 8A:
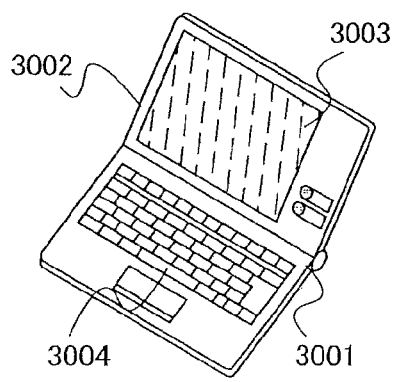
FIGS. 8A to 8F are diagrams each illustrating an electronic device.

FIG. 8A illustrates a laptop personal computer, which includes a main body 3001, a housing 3002, a display portion 3003, a keyboard 3004, and the like. The semiconductor device described in any of Embodiments 1 to 4 is applied to the display portion 3003, whereby a highly reliable laptop personal computer can be provided.

Figure 8B:
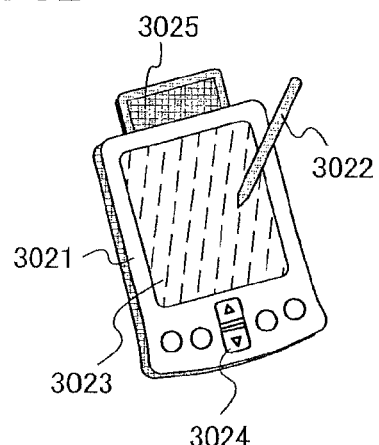

FIG. 8B is a personal digital assistant (PDA) including a display portion 3023, an external interface 3025, an operation button 3024, and the like in a main body 3021. In addition, a stylus 3022 is included as an accessory for operation. The semiconductor device described in any of Embodiments 1 to 4 is applied to the display portion 3023, whereby a highly reliable personal digital assistant (PDA) can be provided.

Figure 8C:
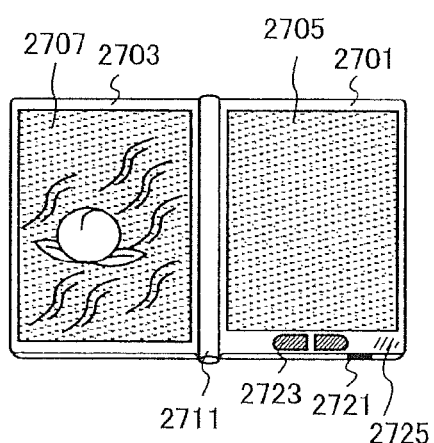

FIG. 8C illustrates an example of an electronic book reader. For example, an electronic book reader includes two housings, a housing 2701 and a housing 2703. The housing 2701 and the housing 2703 are combined with a hinge 2711 so that the electronic book reader can be opened and closed with the hinge 2711 as an axis. With such a structure, the electronic book reader can operate like a paper book.

A display portion 2705 and a display portion 2707 are incorporated in the housing 2701 and the housing 2703, respectively. The display portion 2705 and the display portion 2707 may display one image or different images. In the structure where different images are displayed in the above display portions, for example, the right display portion (the display portion 2705 in FIG. 8C) can display text and the left display portion (the display portion 2707 in FIG. 8C) can display images. The semiconductor device described in any of Embodiments 1 to 4 is applied to the display portion 2705 and the display portion 2707, whereby a highly reliable electronic book reader can be provided.

FIG. 8C illustrates the example in which the housing 2701 is provided with an operation portion and the like. For example, the housing 2701 is provided with a power switch 2721, operation keys 2723, a speaker 2725, and the like. With the operation keys 2723, pages can be turned. Note that a keyboard, a pointing device, or the like may be provided on the surface of the housing, on which the display portion is provided. Furthermore, an external connection terminal (an earphone terminal, a USB terminal, or the like), a recording medium insertion portion, and the like may be provided on the back surface or the side surface of the housing. Moreover, the electronic book reader may have a function of an electronic dictionary.

The electronic book reader may have a configuration capable of wirelessly transmitting and receiving data. Through wireless communication, desired book data or the like can be purchased and downloaded from an electronic book server.

Figure 8D:
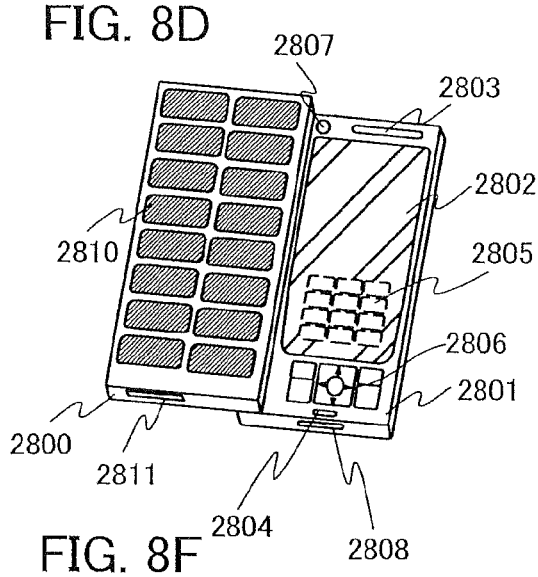

FIG. 8D illustrates a mobile phone, which includes two housings, a housing 2800 and a housing 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 for charging the mobile phone, an external memory slot 2811, and the like. Further, an antenna is incorporated in the housing 2801. The semiconductor device described in any of Embodiments 1 to 4 is applied to the display panel 2802, whereby a highly reliable mobile phone can be provided.

The display panel 2802 is provided with a touch panel. A plurality of operation keys 2805 which are displayed as images are illustrated by dashed lines in FIG. 8D. Note that a boosting circuit by which a voltage output from the solar cell 2810 is increased to be sufficiently high for each circuit is also included.

In the display panel 2802, the display direction can be appropriately changed depending on a usage pattern. Further, the mobile phone is provided with the camera lens 2807 on the same surface as the display panel 2802, and thus it can be used as a video phone. The speaker 2803 and the microphone 2804 can be used for videophone calls, recording and playing sound, and the like as well as voice calls. Moreover, the housing 2800 and the housing 2801 developed as illustrated in FIG. 8D can be slid so that one is lapped over the other; thus, the size of the mobile phone can be reduced, which makes the mobile phone suitable for being carried.

The external connection terminal 2808 can be connected to an AC adapter and various types of cables such as a USB cable, and charging and data communication with a personal computer or the like are possible. Moreover, a large amount of data can be stored by inserting a storage medium into the external memory slot 2811 and can be moved.

Further, in addition to the above functions, an infrared communication function, a television reception function, or the like may be provided.

Figure 8E:
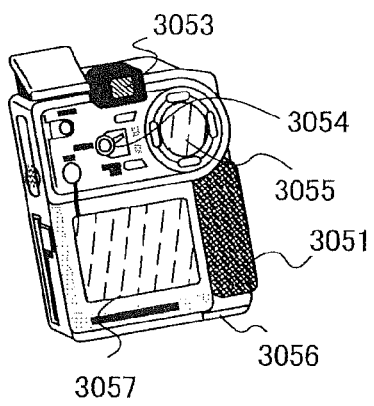

FIG. 8E illustrates a digital video camera which includes a main body 3051, a display portion A 3057, an eyepiece 3053, an operation switch 3054, a display portion B 3055, a battery 3056, and the like. The semiconductor device described in any of Embodiments 1 to 4 is applied to the display portion A 3057 and the display portion B 3055, whereby a highly reliable digital video camera can be provided.

Figure 8F:
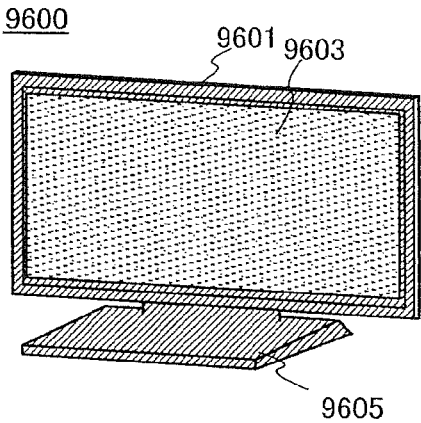

FIG. 8F illustrates an example of a television set. In a television set 9600, a display portion 9603 is incorporated in a housing 9601. The display portion 9603 can display images. Here, the housing 9601 is supported by a stand 9605. The semiconductor device described in any of Embodiments 1 to 4 is applied to the display portion 9603, whereby a highly reliable television set can be provided.

The television set 9600 can be operated by an operation switch of the housing 9601 or a separate remote controller. Further, the remote controller may be provided with a display portion for displaying data output from the remote controller.

Note that the television set 9600 is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) data communication can be performed.

This embodiment can be implemented in appropriate combination with the structures described in other embodiments.

This application is based on Japanese Patent Application serial no. 2010-072256 filed with Japan Patent Office on Mar. 26, 2010, the entire contents of which are hereby incorporated by reference.

The invention claimed is:

1. A semiconductor device comprising:
   a gate electrode;
   a gate insulating film;
   an oxide semiconductor film overlapping the gate electrode with the gate insulating film therebetween;
   a source electrode and a drain electrode electrically connected to the oxide semiconductor film; and
   a metal oxide film over the source electrode and the drain electrode and in contact with a top surface of the oxide semiconductor film,
   wherein the oxide semiconductor film contains indium, gallium, and zinc, and
   wherein the metal oxide film contains gallium and indium.

2. The semiconductor device according to claim 1, wherein a thickness of the metal oxide film is larger than a thickness of the oxide semiconductor film.

3. The semiconductor device according to claim 1, wherein the oxide semiconductor film is over the gate electrode.

4. The semiconductor device according to claim 1, wherein a difference between a band gap of the metal oxide film and a band gap of the oxide semiconductor film is less than 3.0 eV.

5. The semiconductor device according to claim 1, wherein a hydrogen concentration of the metal oxide film is lower than or equal to a hydrogen concentration of the oxide semiconductor film.

6. The semiconductor device according to claim 1, wherein the metal oxide film is in contact with the gate insulating film.

7. A semiconductor device comprising:
a gate electrode;
a gate insulating film;
an oxide semiconductor film overlapping the gate electrode with the gate insulating film therebetween;
a source electrode and a drain electrode electrically connected to the oxide semiconductor film; and
a metal oxide film over the source electrode and the drain electrode and in contact with a top surface of the oxide semiconductor film,
wherein the oxide semiconductor film contains indium, gallium and zinc, and
wherein the metal oxide film contains gallium and zinc.

8. The semiconductor device according to claim 7, wherein a thickness of the metal oxide film is larger than a thickness of the oxide semiconductor film.

9. The semiconductor device according to claim 7, wherein the oxide semiconductor film is over the gate electrode.

10. The semiconductor device according to claim 7, wherein a difference between a band gap of the metal oxide film and a band gap of the oxide semiconductor film is less than 3.0 eV.

11. The semiconductor device according to claim 7, wherein a hydrogen concentration of the metal oxide film is lower than or equal to a hydrogen concentration of the oxide semiconductor film.

12. The semiconductor device according to claim 7, wherein the metal oxide film is in contact with the gate insulating film.

13. A semiconductor device comprising:
a gate electrode;
a gate insulating film;
an oxide semiconductor film overlapping the gate electrode with the gate insulating film therebetween;
a source electrode and a drain electrode electrically connected to the oxide semiconductor film;
a metal oxide film over the source electrode and the drain electrode and in contact with a top surface of the oxide semiconductor film; and
a pixel electrode electrically connected to the source electrode or the drain electrode through a contact hole in the metal oxide film,
wherein the oxide semiconductor film contains indium, gallium and zinc,
wherein the metal oxide film contains gallium and at least one of indium and zinc, and
wherein a difference between a band gap of the metal oxide film and a band gap of the oxide semiconductor film is less than 3.0 eV.

14. The semiconductor device according to claim 13, wherein a thickness of the metal oxide film is larger than a thickness of the oxide semiconductor film.

15. The semiconductor device according to claim 13, wherein a hydrogen concentration of part of the metal oxide film is lower than or equal to a hydrogen concentration of the oxide semiconductor film.

16. The semiconductor device according to claim 13, wherein the metal oxide film is in contact with the gate insulating film.

* * * * *